(12) United States Patent  
Baek et al.

(10) Patent No.: US 12,008,962 B2  
(45) Date of Patent: Jun. 11, 2024

(54) DISPLAY DEVICE AND CIRCUIT FOR COMPENSATING FOR MOBILITY CHARACTERISTIC OF THE DISPLAY DEVICE

(71) Applicant: LG DISPLAY CO., LTD., Seoul (KR)

(72) Inventors: Lokdam Baek, Paju-si (KR); Hyunho Bae, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/557,111

(22) Filed: Dec. 21, 2021

(65) Prior Publication Data

US 2022/0208111 A1 Jun. 30, 2022

(30) Foreign Application Priority Data

Dec. 31, 2020 (KR) .................. 10-2020-0189813

(51) Int. Cl.
*G09G 3/32* (2016.01)
*G09G 3/3266* (2016.01)
(Continued)

(52) U.S. Cl.
CPC .............. *G09G 3/3266* (2013.01); *G09G 3/32* (2013.01); *G09G 3/3225* (2013.01); *G09G 2300/0413* (2013.01); *G09G 2300/0417* (2013.01); *G09G 2300/0452* (2013.01); *G09G 2310/0216* (2013.01); *G09G 2310/027* (2013.01);
(Continued)

(58) Field of Classification Search
CPC ...... G09G 3/3266; G09G 3/32; G09G 3/3225; G09G 2300/0413; G09G 2300/0417; G09G 2300/0452; G09G 2310/0216; G09G 2310/027; G09G 2310/0289; G09G 2310/61; G09G 2310/08; G09G 2320/0233; G09G 2320/0295; G09G 2320/041; G09G 2320/045; G09G 2330/045;
(Continued)

(56) References Cited

U.S. PATENT DOCUMENTS

2018/0366082 A1* 12/2018 Chen ................... G09G 3/3266
2019/0197964 A1* 6/2019 Cho .................... G09G 3/3275
(Continued)

FOREIGN PATENT DOCUMENTS

| CN | 1848220 A | 10/2006 |
| CN | 109961732 A | 7/2019 |

(Continued)

OTHER PUBLICATIONS

Chinese Office Action dated Nov. 6, 2023 issued in Patent Application No. 202111499650.1 w/English translation (12 pages).

*Primary Examiner* — Adam J Snyder  
(74) *Attorney, Agent, or Firm* — POLSINELLI PC

(57) ABSTRACT

A display device includes an N-phase level shifter configured to receive an output cancellation signal, a first reference signal, and a second reference signal from a timing controller, and to output N sensing clock signals to a gate driver, and the gate driver configured to receive the N sensing clock signals from the N-phase level shifter, and to output N sensing output signals to first to n-th gate lines, wherein the N-phase level shifter is configured to receive the output cancellation signal having a number of pulses during a blank period, and the a is at least two.

15 Claims, 15 Drawing Sheets

(51) Int. Cl.
  *G09G 3/3225* (2016.01)
  *G11C 7/10* (2006.01)
  *G11C 11/4093* (2006.01)

(52) U.S. Cl.
  CPC ............... *G09G 2310/0289* (2013.01); *G09G 2310/061* (2013.01); *G09G 2310/08* (2013.01); *G09G 2320/0233* (2013.01); *G09G 2320/0295* (2013.01); *G09G 2320/041* (2013.01); *G09G 2320/045* (2013.01); *G09G 2330/045* (2013.01); *G09G 2330/12* (2013.01); *G11C 7/1009* (2013.01); *G11C 7/1093* (2013.01); *G11C 11/4093* (2013.01)

(58) Field of Classification Search
  CPC .................... G09G 2330/12; G11C 7/1009; G11C 7/1093; G11C 11/4093
  See application file for complete search history.

(56) References Cited

U.S. PATENT DOCUMENTS

| | | | |
|---|---|---|---|
| 2020/0082747 A1* | 3/2020 | Tian | G09G 3/3677 |
| 2020/0234665 A1* | 7/2020 | Chen | G09G 3/3266 |
| 2021/0225291 A1* | 7/2021 | Lee | G09G 3/3266 |

FOREIGN PATENT DOCUMENTS

| | | | | |
|---|---|---|---|---|
| CN | 210349269 U | | 4/2020 | |
| CN | 111145676 A | | 5/2020 | |
| KR | 1020160089648 A | * | 7/2016 | ........... G09G 3/3225 |
| KR | 1020180078909 A | * | 7/2018 | ........... G09G 3/3233 |

\* cited by examiner

DISPLAY DEVICE AND CIRCUIT FOR COMPENSATING FOR MOBILITY CHARACTERISTIC OF THE DISPLAY DEVICE

CROSS-REFERENCE TO RELATED APPLICATION

The present application claims the priority of Korean Patent Application No. 10-2020-0189813, filed on Dec. 31, 2020, which is hereby incorporated by this reference in its entirety.

BACKGROUND

Field of the Disclosure

The present disclosure relates to a display device. More particularly, the present disclosure relates to a display device capable of increasing the efficiency of a real-time compensation by controlling a level shifter when the display device is driven.

Description of the Background

With the advancement of information-oriented society, various types of display devices have been developed. Recently, various display devices such as a liquid crystal display (LCD) device, a plasma display panel (PDP) display device, and an organic light-emitting display (OLED) device have been utilized.

An organic light-emitting element constituting the organic light-emitting display device is self-luminous and does not require a separate light source, so that the thickness and the weight of a display device may be reduced. In addition, the organic light-emitting display device has high quality characteristics, such as low power consumption, high luminance, and a high response rate.

Such an organic light-emitting display device may have degradation in display quality due to the characteristics of transistors included within the organic light-emitting display device or due to the degradation of an organic light-emitting element.

SUMMARY

Accordingly, the present disclosure has been made keeping in mind the above problems occurring in the conventional art, and the present disclosure is intended to propose a method of sensing characteristics of a driving transistor of a subpixel in real-time and compensating for the characteristics of the driving transistor, and to propose a display device that is driven by the method.

According to the present disclosure, the display device includes: an N-phase level shifter configured to receive an output cancellation signal, a first reference signal, and a second reference signal from a timing controller, and to output N sensing clock signals to a gate driver; and the gate driver configured to receive the N sensing clock signals from the N-phase level shifter, and to output N sensing output signals to first to n-th gate lines, wherein the N-phase level shifter may be configured to receive the output cancellation signal having a number of pulses during a blank period, and the a may be at least two.

According to the present disclosure, by sensing and compensating characteristic values of the driving transistor disposed on each subpixel, image quality of the display device may be improved.

In addition, according to the present disclosure, subpixels disposed on at least two gate lines are capable of being sensed during one blank period, so that efficiency and speed of the compensation may be improved.

In addition, according to the present disclosure, multiple gate lines that are to be the target of sensing are controlled not to overlap each other, so that the efficiency of the compensation may be improved.

In addition, according to the present disclosure, an effective method of determining the multiple gate lines that are to be the target of sensing may be provided.

In addition, according to the present disclosure, a method for effectively selecting orders of the multiple gate lines that are to be the target of sensing may be provided.

BRIEF DESCRIPTION OF THE DRAWINGS

The above and other features and advantages of the present disclosure will be more clearly understood from the following detailed description when taken in conjunction with the accompanying drawings, in which.

DETAILED DESCRIPTION

Figure 1:
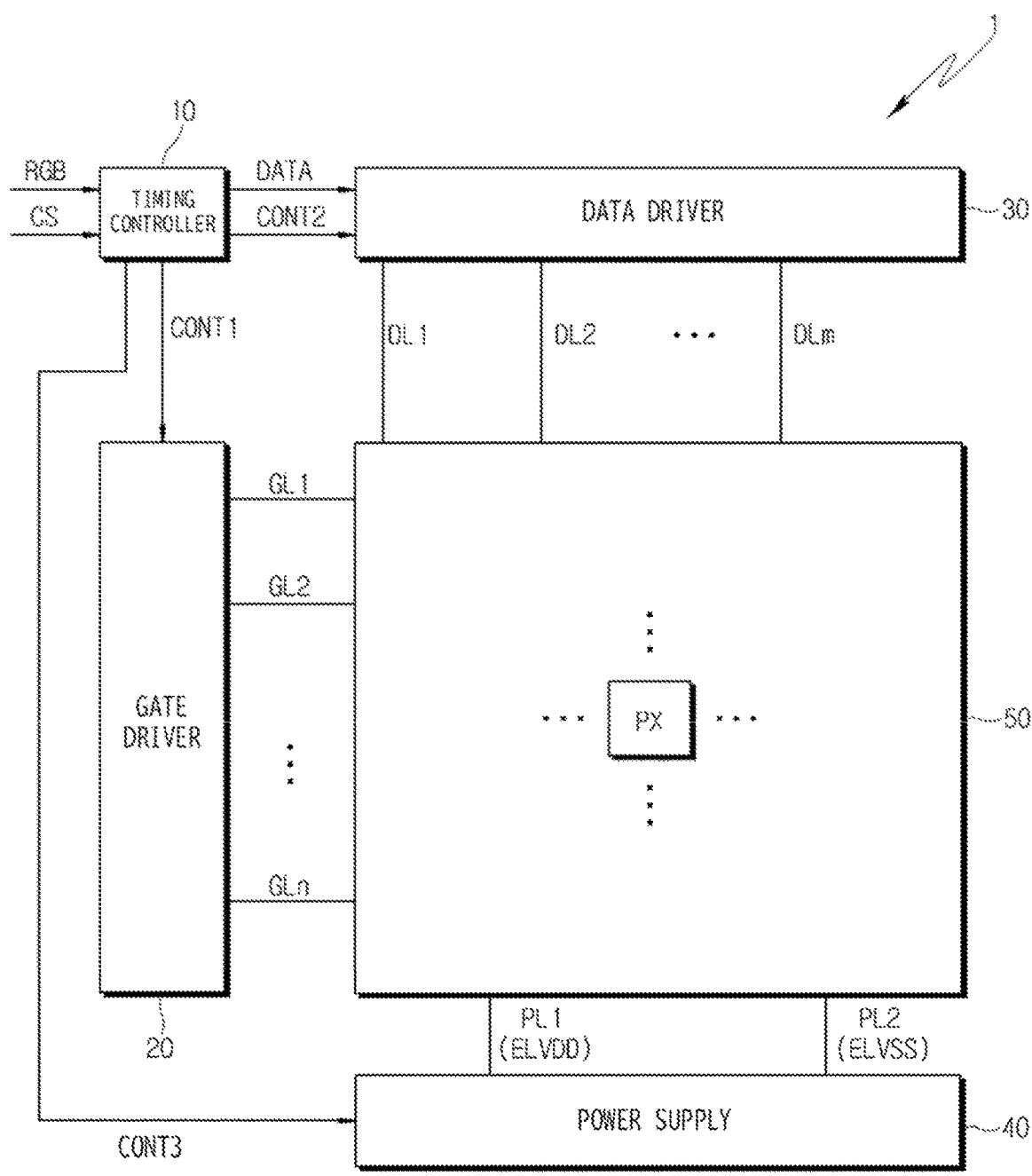
FIG. 1 is a block diagram illustrating a configuration of a display device according to an aspect of the present disclosure.

Hereinafter, aspects of the present disclosure will be described in detail with reference to the accompanying drawings. In this specification, it will be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the drawings, the thickness, ratio, and dimensions of components are exaggerated for clarity of illustration. The term "and/or" includes one or more combinations that the associated elements may define.

It will be understood that although the terms such as "first" and "second" are used herein to describe various elements, these elements should not be limited by these terms. The terms are only used to distinguish one component from other components. For example, a first element referred to as a first element in one aspect can be referred to as a second element in another aspect without departing from the scope of the appended claims. The terms of a singular form may include plural forms unless referred to the contrary.

Also, "under", "below", "above", "upper", and the like are used for explaining relation association of components illustrated in the drawings. These terms are relative concepts and are described on the basis of the direction in the drawings.

The meaning of the term "include" or "comprise" specifies a property, a fixed number, a step, an operation, an element, a component or a combination thereof, but does not exclude other properties, fixed numbers, steps, operations, elements, components or combinations thereof.

FIG. 1 is a block diagram illustrating a configuration of a display device according to an aspect of the present disclosure.

Referring to FIG. 1, a display device 1 includes a timing controller 10, a gate driver 20, a data driver 30, a power supply 40, and a display panel 50.

The timing controller 10 may receive an image signal RGB and a control signal CS from outside. The image signal RGB may include a plurality of gray scale data. The control signal CS may include, for example, a horizontal synchronization signal, a vertical synchronization signal, and a main clock signal.

The timing controller 10 may process the image signal RGB and the control signal CS to make the signals appropriate for an operation condition of the display panel 50, so that the timing controller 10 may output image data DATA, a gate driving control signal CONT1, a data driving control signal CONT2, and a power supply control signal CONT3.

The gate driver 20 may be connected to pixels PX of the display panel 50 through multiple gate lines GL1 to GLn. The gate driver 20 may generate gate signals on the basis of the gate driving control signal CONT1 output from the timing controller 10. The gate driver 20 may provide the generated gate signals to the pixels PX through the multiple gate lines GL1 to GLn.

In various aspects, the gate driver 20 may be further connected to the pixels PXs of the display panel 50 through multiple second gate lines GL21 to Gl2n (not illustrated). The gate driver 20 may provide a sensing signal to the pixels PX through the multiple second gate lines GL21 to Gl2n (not illustrated). The sensing signal may be supplied so as to measure a characteristic of a driving transistor and/or a light-emitting element provided inside the pixels PX.

The multiple gate lines GL1 to GLn as described above may be scan lines that transmit a gate control signal for controlling ON/OFF of a switching transistor that is connected to the pixels PX. For example, a scan output signal SCOUT1 to SCOUTn may be output through each of the multiple gate lines GL1 to GLn. The multiple second gate lines GL21 to GL2n as described above may be sensing lines that transmit a control signal for performing a compensation therethrough. For example, sensing output signals SEOUT1 to SEOUTn may be output through each of the multiple second gate lines GL21 to GL2n.

The multiple gate lines GL1 to GLn and the multiple second gate lines GL21 to Gl2n as described above may be configured as one line.

The data driver 30 may be connected to the pixels PX of the display panel 50 through multiple data lines DL1 to DLm. The data driver 30 may generate data signals on the basis of the image data DATA and the data driving control signal CONT2 output from the timing controller 10. The data driver 30 may provide the generated data signals to the pixels PX through the multiple data lines DL1 to DLm.

In various aspects, the data driver 30 may be further connected to the pixels PX of the display panel 50 through multiple sensing lines (or reference lines) SL1 to SLm (not illustrated). The data driver 30 may provide a reference voltage (a sensing voltage, or an initialization voltage) to the pixels PX through the multiple sensing lines SL1 to SLm (not illustrated), or may sense states of the pixels PX on the basis of an electrical signal fed back from the pixels PX.

The power supply 40 may be connected to the pixels PX of the display panel 50 through multiple power lines PL1 and PL2. The power supply 40 may generate a driving voltage to be provided to the display panel 50, on the basis of the power supply control signal CONT3. The driving voltage may include, for example, a high-potential driving voltage ELVDD and a low-potential driving voltage ELVSS. The power supply 40 may provide the generated driving voltages ELVDD and ELVSS to the pixels PX, through the corresponding power lines PL1 and PL2.

In the display panel 50, multiple pixels PX are disposed. The pixels PX may be, for example, arranged in a matrix form on the display panel 50.

Each pixel PX may be electrically connected to the corresponding gate line and the corresponding data line. The pixels PX may emit light with luminance corresponding to the gate signals and the data signals that are supplied through the gate lines GL1 to GLn and the data lines DL1 to DLm, respectively.

Each pixel PX may display any one of a first to a third colors. For example, each pixel PX may also display any one of red, green, and blue colors. In another aspect, each pixel PX may display any one of cyan, magenta, and yellow colors. In another aspect, the pixels PX may be configured to display any one of four or more colors. For example, each pixel PX may also display any one of red, green, blue, and white colors.

The timing controller 10, the gate driver 20, the data driver 30, and the power supply 40 may be configured as separate integrated circuits (ICs), or ICs in which at least some thereof are integrated. For example, at least one among the data driver 30 and the power supply 40 may be configured as an integrated circuit integrated with the timing controller 10.

In addition, in FIG. 1, the gate driver 20 and the data driver 30 are illustrated as elements separated from the display panel 50, but at least one among the gate driver 20 and the data driver 30 may be configured in an in-panel manner that is formed integrally with the display panel 50. For example, the gate driver 20 may be formed integrally with the display panel 50 according to a gate-in-panel (GIP) manner.

According to an aspect of the present disclosure, a level shifter 15 (see FIG. 10) may be further included between the timing controller 10 and the gate driver 20. The level shifter 15 (see FIG. 10) may receive a first reference signal GCLK, a second reference signal MCLK, an output cancellation signal MUTE, an M-node charge signal LSP, a Q-node total discharge signal VSP_AA, a Q-node charge signal RST1, a Q-node discharge signal RST2, and the like, from the timing controller 10. In addition, the level shifter 15 (see FIG. 10) may transmit a carry clock signal CRCLK, a scan clock signal SCCLK, and a sensing clock signal SECLK to the gate driver 20. In addition, the level shifter 15 (see FIG. 10) may transmit the first reference signal GCLK, the second reference signal MCLK, the output cancellation signal MUTE, the M-node charge signal LSP, the Q-node total discharge signal VSP_AA, the Q-node charge signal RST1, the Q-node discharge signal RST2, and the like that are received from the timing controller 10, to the gate driver 20. A detailed description of the level shifter 15 (see FIG. 10) as described above will be described in FIG. 10.

Figure 2:
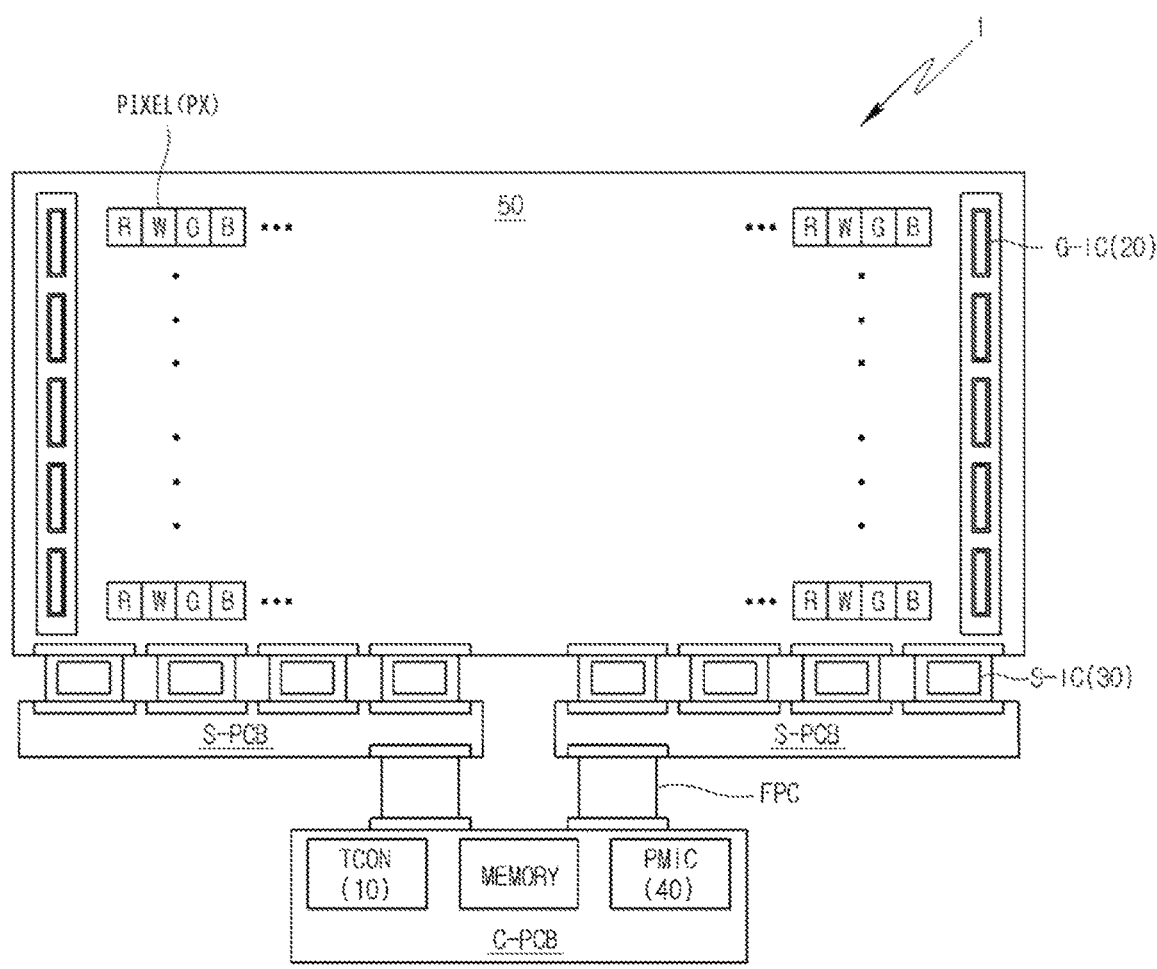
FIG. 2 is a view illustrating the display device according to the present disclosure.

FIG. 2 is a view illustrating the display device according to an aspect of the present disclosure.

Referring to FIG. 2, the display panel 50 in a rectangular shape is illustrated, and the display panel 50 includes the multiple pixels PX arranged within in the form of columns and rows. For example, the plurality of pixels PX may include four subpixels, and the four subpixels may be a red subpixel, a white subpixel, a green subpixel, and a blue subpixel, respectively.

In addition, the display device 1 includes a gate driving IC (G-IC) 20. The display panel 50 may be implemented in a gate-in-panel (GIP) manner in which the gate driving IC 20 is disposed within the display panel 50. The gate driving IC 20 may be attached to a left side, a right side, or the left and right sides of the display panel 50. The gate driving IC 20 may be referred to as the gate driver 20.

In addition, the display device 1 includes a data driving IC (source driving IC: S-IC) 30. The source driving IC 30 may be attached below the display panel 50, or multiple source driving ICs 30 may be attached in a transverse direction of the display panel 50. Such a source driving IC 30 may be implemented in a chip on film (COF) manner where it is disposed within a flexible PCB (FPCB), a chip-on-glass (COG) manner where it is disposed on a glass substrate constituting the display panel 50, and the like. The source driving IC 30 may be referred to as the data driver 30.

For example, in the aspect illustrated in FIG. 2, the source driving IC 30 is implemented in the COF manner, and the FPCB connects the display panel 50 and a source PCB (S-PCB) through pad connection. The source driving IC 30 may transmit a voltage (source IC driving voltage, EVDD, EVSS, VREF, etc.) provided to the display panel 50 from a control PCB (C-PCB).

The source PCB (S-PCB) is disposed below the display panel 50, and includes: an N-phase level shifter configured to receive an output cancellation signal, a first reference signal, and a second reference signal from a timing controller, and to output N sensing clock signals to a gate driver; and the gate driver configured to receive the N sensing clock signals from the N-phase level shifter, and to output N sensing output signals to first to n-th gate lines, wherein the N-phase level shifter is configured to receive the output cancellation signal having a number of pulses during a blank period, and the a is at least two. The source PCB (S-PCB) may be connected to the display panel 50 through the FPCB, and may be connected to the control PCB (C-PCB) through a flexible plat cable (FPC) connection. The source PCB (S-PCB) is directly connected to the source driving IC 30 and transmits the gate signal to the gate driving IC 20. In addition, the source PCB (S-PCB) receives power (ELVDD, ELVSS, VGH, VHL, VREF, etc.) from the control PCB (C-PCB) and transmits it to the display panel 50. In addition, a connection between the control PCB (C-PCB) and the gate driving IC 20 is provided through the leftmost or rightmost source driving IC 30 of the source PCB (S-PCB). For example, a gate driving IC driving voltage, a gate high voltage VGH, a gate low voltage VGL, etc., are transmitted from the control PCB (C-PCB) to the gate driving IC 20 through the source PCB (S-PCB).

The control PCB (C-PCB) is disposed below the display panel 50, and is connected to the display panel 50 through the source PCB (S-PCB) and the cable FPC. The control PCB (C-PCB) may include the timing controller (TCON) 10, the power supply 40, and a memory. The description of the timing controller 10 and the power supply 40 is the same as the description with reference to FIG. 1. In addition, the control PCB (C-PCB) calculates an algorithm for every frame of an output image data to be output, stores compensation data, and requires an area for storing various parameters required for the algorithm calculation or various parameters for tuning. Accordingly, a volatile memory and/or a non-volatile memory may be disposed on the control PCB (C-PCB). In addition, the level shifter 15 (see FIG. 10) may be disposed on the control PCB (C-PCB). Further, the level shifter 15 (see FIG. 10) may be disposed between the timing controller (TCON) 10 and the gate driving IC 20, and may be connected to the timing controller (TCON) 10 and the gate driving IC 20. A detailed description of the level shifter 15 (see FIG. 10) as described above will be described later with reference to FIG. 10.

Figure 3:
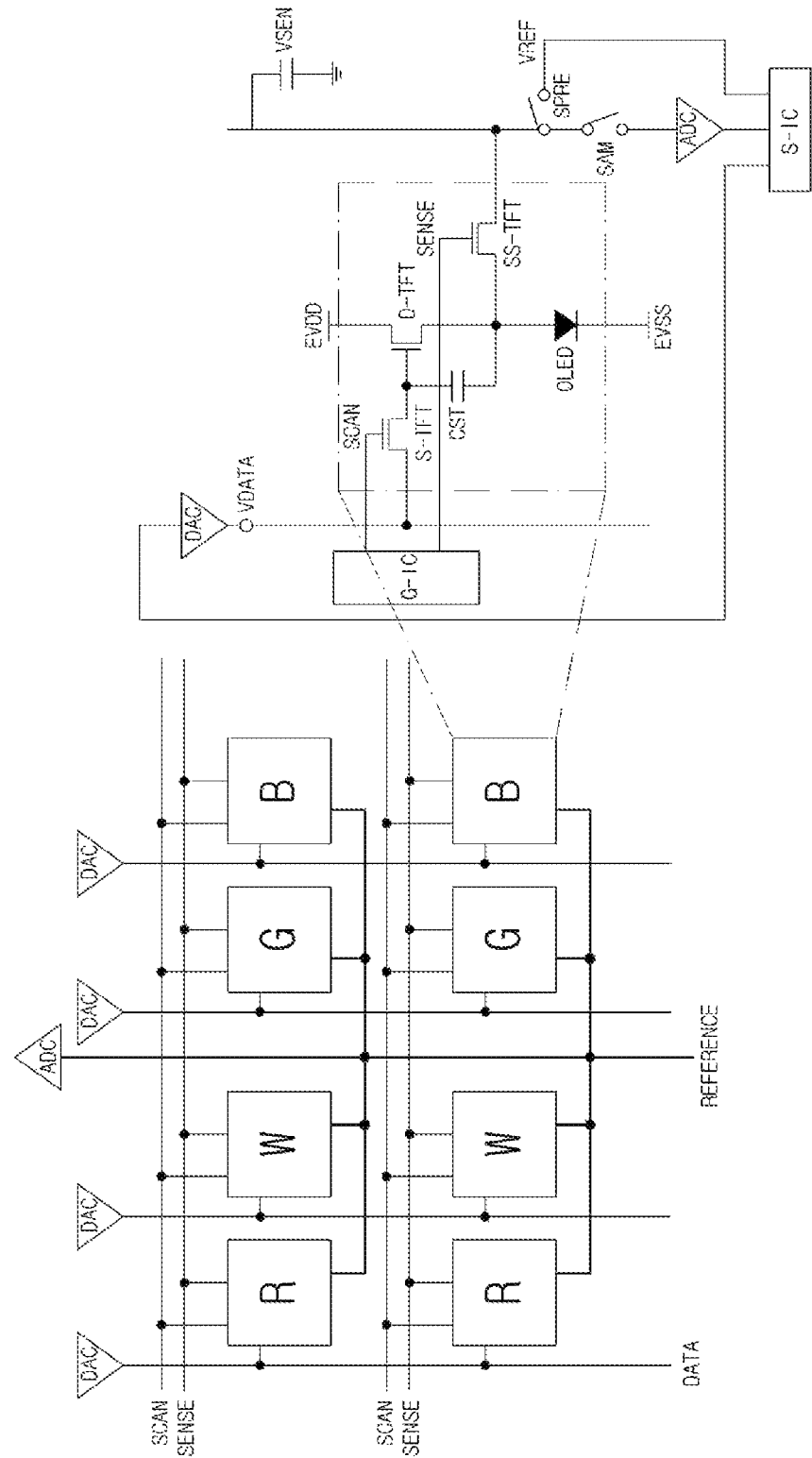
FIG. 3 is a view illustrating a structure of a pixel according to an aspect of the present disclosure.

FIG. 3 is a view illustrating a structure of a pixel according to an aspect of the present disclosure.

Referring to FIG. 3, one pixel includes four subpixels R, W, G, and B, and each of the subpixels is connected to the gate driving IC (G-IC), a scan line SCAN, and a sensing line SENSE, and is connected to the source driving IC (S-IC) through a reference line REFERENCE. In addition, each subpixel receives a data voltage VDATA from the source driving IC (S-IC) through a digital analog converter (DAC). In addition, a sensing voltage VSEN output from each subpixel is provided to the source driving IC (S-IC) through an analog digital converter (ADC). In addition, each subpixel is connected to the high-potential driving voltage ELVDD and the low-potential driving voltage ELVSS.

Each subpixel includes a scan TFT (S-TFT), a driving TFT (D-TFT), and a sensing TFT (SS-TFT). In addition, each subpixel includes a storage capacitor CST and a light-emitting element OLED.

A first electrode (for example, a source electrode) of the scan transistor (S-TFT) is connected to the data line DL, and the data voltage VDATA is output from the source driving IC (S-IC) and is applied to the data line through the DAC. A second electrode (for example, a drain electrode) of the scan transistor (S-TFT) is connected to one end of the storage capacitor CST and is connected to a gate electrode of the driving TFT (D-TFT). The gate electrode of the scan transistor (S-TFT) is connected to the scan line (or the gate line GL). That is, the scan transistor (S-TFT) is turned on when the gate signal at a gate-on level is applied through the scan line SCAN, so that the data signal applied through the data line DL is transmitted to one end of the storage capacitor CST. The scan transistor (S-TFT) may be referred to as a switching transistor. In addition, a signal applied through the scan line SCAN to the gate electrode of the scan transistor S-TFT may be the scan output signal SCOUT.

One end of the storage capacitor CST is connected to a third electrode (for example, a drain electrode) of the scan TFT (S-TFT). The other end of the storage capacitor CST is configured to receive the high-potential driving voltage ELVDD. The storage capacitor CST may charge a voltage corresponding to a difference between a voltage applied to one end thereof and the high-potential driving voltage ELVDD applied to the other end thereof. In addition, the storage capacitor CST may charge a voltage corresponding to a difference between the voltage applied to one end thereof and a reference voltage VREF applied to the other end thereof through a switch SPRE and the sensing TFT (SS-TFT).

A first electrode (For example, a source electrode) of the driving transistor (D-TFT) is configured to receive the high-potential driving voltage ELVDD, and a second electrode (for example, a drain electrode) is connected to a first electrode (for example, an anode electrode) of the light-emitting element OLED. A third electrode (for example, a gate electrode) of the driving transistor (D-TFT) is connected to one end of the storage capacitor CST. The driving transistor (D-TFT) is turned on when a voltage at the gate-on level is applied, and may control an amount of a driving current flowing through the light-emitting element OLED in response to a voltage provided to the gate electrode. That is, the current is determined by a voltage difference in the driving TFT (D-TFT) Vgs (or a storage voltage difference in the storage capacitor CST) and is applied to the light-emitting element OLED.

A first electrode (for example, a source electrode) of the sensing TFT (SS-TFT) is connected to the reference line REFERENCE, and a second electrode (for example, a drain electrode) is connected to the other end of the storage capacitor CST. A third electrode (for example, a gate electrode) is connected to the sensing line SENSE. That is, the sensing TFT (SS-TFT) is turned on by a sensing signal output from the gate driving IC (G-IC) and applies the reference voltage VREF to the other end of the storage capacitor CST. If both the switch SPRE and another switch SAM are turned off and the sensing TFT (SS-TFT) is turned on, the storage voltage of the storage capacitor CST is transmitted to the capacitor of the reference line, and the sensing voltage VSEN is stored in the capacitor of the reference line. A voltage applied to the gate electrode of the sensing TFT (SS-TFT) may be the sensing output signal SEOUT.

If the switch SPRE is turned off and another switch SAM is turned on, the voltage VSEN stored in the reference line capacitor is output to the source driving IC (S-IC) through the ADC. This output voltage is used soon as a voltage for sensing and sampling a degradation of a corresponding subpixel. That is, a voltage for compensating for a corresponding subpixel may be sensed and sampled. Specifically, the characteristics of the driving TFT (D-TFT) are classified into two types of mobility and threshold voltage, and the compensation may be implemented by sensing the mobility and threshold voltage of the driving TFT (D-TFT). In addition, the characteristics of the corresponding subpixel may be also determined by the degradation of the light-emitting element OLED, and it is necessary to sense and compensate for the degree of degradation of the light-emitting element OLED. Hereinafter, a real-time (RT) compensation method will be described. The real-time compensation method is a method in which the mobility and the threshold voltage of the driving TFT (D-TFT) is compensated in real-time while the display device 1 is powered on and outputs the image data.

The light-emitting element OLED outputs light corresponding to the driving current. The light-emitting element OLED may output light corresponding to any one of red, white, green, and blue colors. The light-emitting element OLED may be an organic light-emitting diode (OLED) or an ultra-small inorganic light-emitting diode having a size in a micro to nanoscale range, but the present disclosure is not limited thereto. Hereinafter, the technical idea of the present disclosure will be described with reference to an aspect in which the light-emitting element LD is formed of an organic light-emitting diode.

FIG. 3 illustrates an example in which a switching transistor ST, the driving transistor D-TFT, and the sensing transistor SS-TFT are NMOS transistors. However, the present disclosure is not limited thereto. For example, at least some or all of the transistors constituting each pixel PX may be constructed as a PMOS transistor. In various aspects, each of the switching transistor ST and the driving transistor DT may be implemented as a low-temperature polycrystalline silicon (LTPS) thin-film transistor, an oxide thin-film transistor, or a low-temperature polycrystalline oxide (LTPO) thin-film transistor.

In addition, in the description with reference to FIG. 3, it is illustrated that four subpixels share one reference line REFERENCE. However, the present disclosure is not limited thereto. A different number of subpixels may share one reference line REFERENCE, or each subpixel may be connected to one reference line REFERENCE. In the present specification, for convenience of description, as illustrated in FIG. 3, it is described that four subpixels share one reference line REFERENCE, and it should be construed as an example.

FIGS. 4 to 8 are views illustrating compensation for a mobility characteristic while the display device is driven. That is, the compensation in the present description is a compensation that is performed while the display device is powered on and the image data is being output. In addition, the compensation in the present description corresponds to a compensation for correcting a deviation by sensing the mobility characteristic of the driving TFT (D-TFT).

The sensing of the mobility characteristic during the driving of the display device may be performed in a blank period between one frame and the next frame. In addition, since four subpixels share one reference line, the sensing of the four subpixels may not be simultaneously performed. In addition, subpixels having one color among the subpixels connected to any gate line may be sensed in a blank period and subpixels having other colors among the subpixels connected to the gate line may be sensed in the next blank period. This is because all the subpixels connected to the gate line may not be sensed since the blank period is short.

Figure 4:
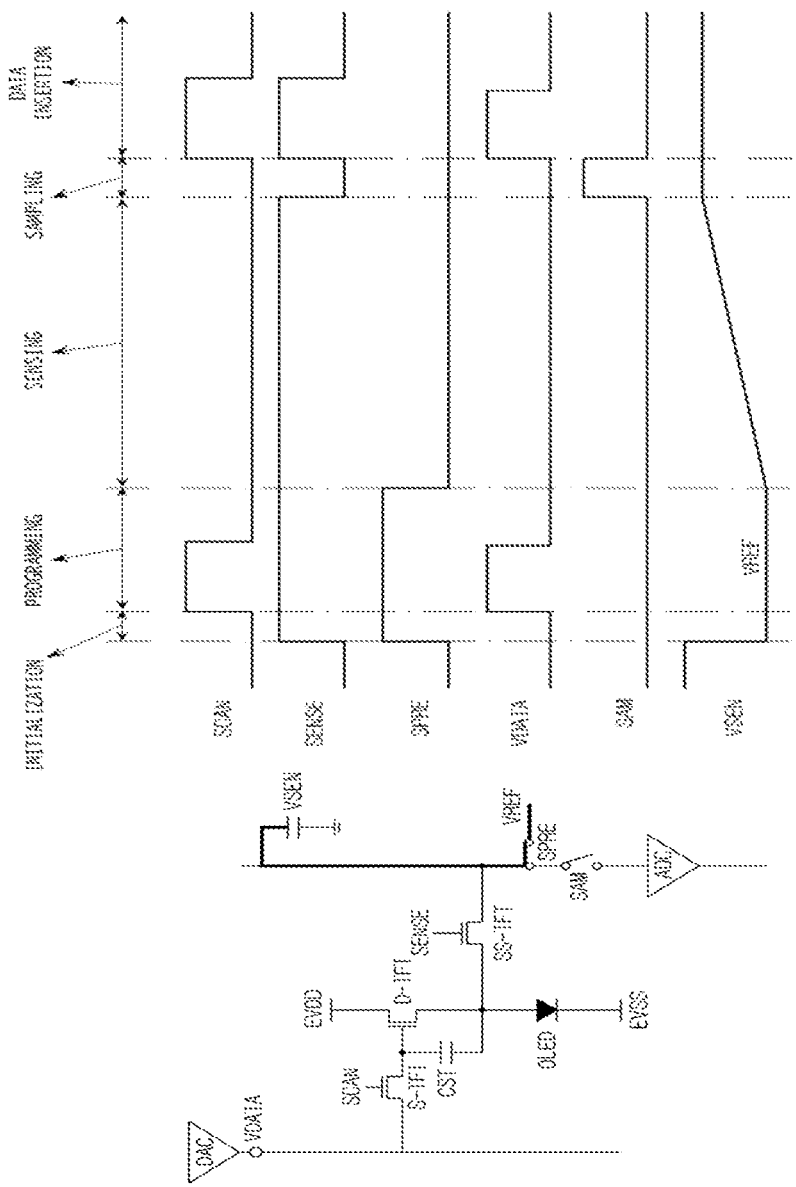
FIGS. 4 to 8 are views illustrating compensation for a mobility characteristic while the display device is driven.

Referring to FIG. 4, the switch SPRE is turned on in an initialization period. Accordingly, the sensing voltage VSEN stored in the capacitor of the reference line is equal to the reference voltage VREF.

Figure 5:
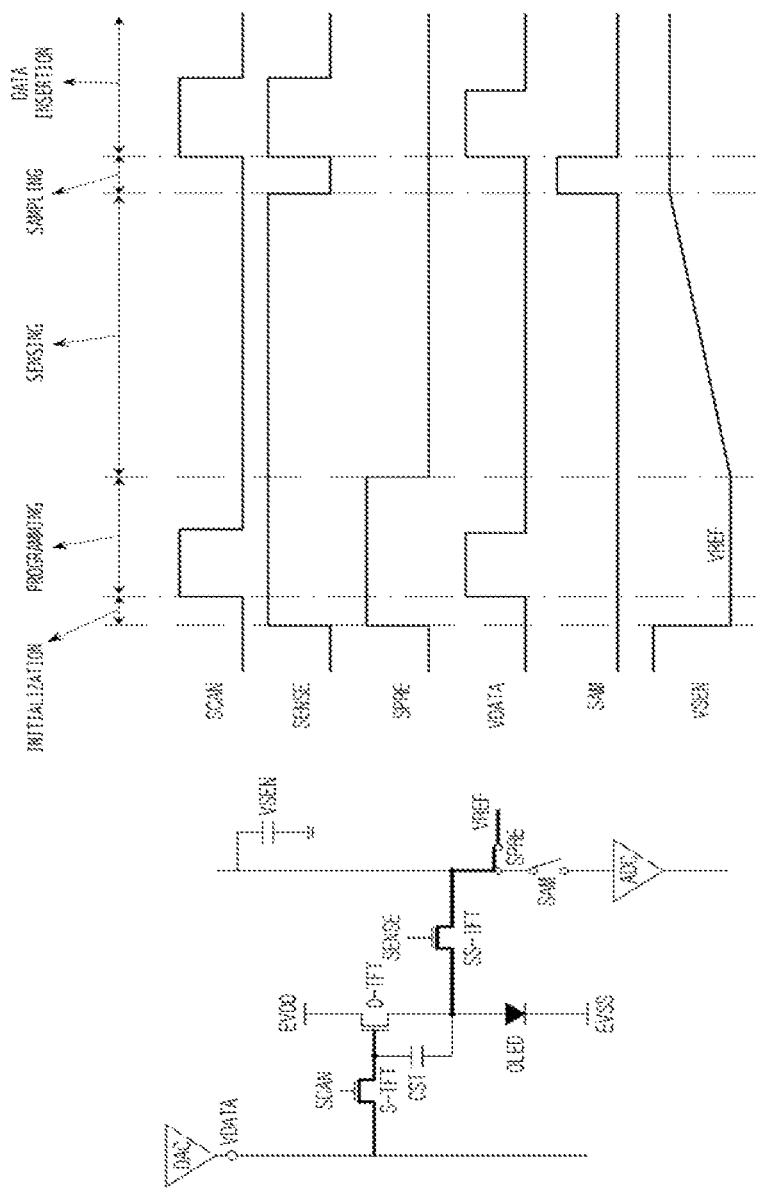

Referring to FIG. 5, the scan TFT (S-TFT) is turned on in a programming period. In addition, the data voltage VDATA is a high voltage. Accordingly, a charge corresponding to the data voltage VDATA is charged at one end of the storage capacitor CST. In addition, in the programming period, the sensing TFT (SS-TFT) is turned on and the switch SPRE is turned on. Accordingly, the other end of the storage capacitor CST is charged with a charge corresponding to the reference voltage VREF. That is, the voltage across the storage capacitor CST corresponds to a difference between the data voltage VDATA and the reference voltage VREF. Meanwhile, since the switch SPRE is maintained to be turned on, the sensing voltage VSEN is maintained as the reference voltage VREF.

Figure 6:
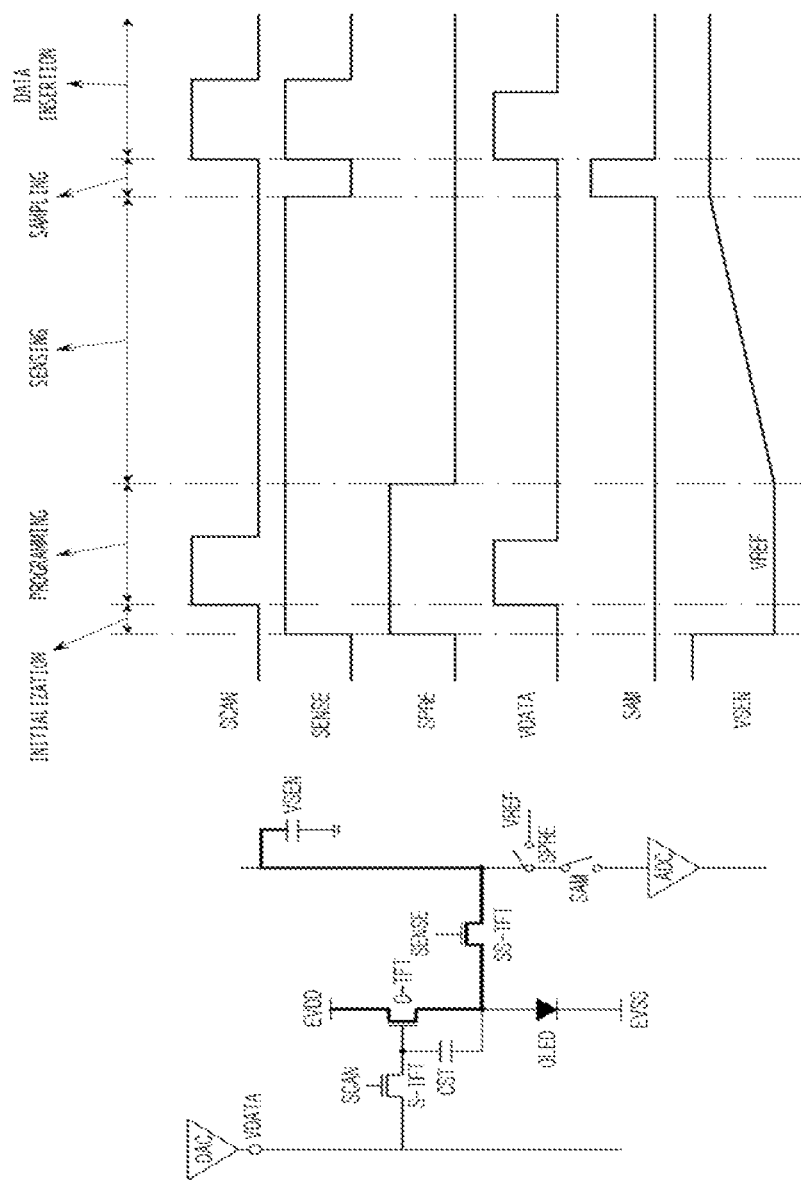

Referring to FIG. 6, in a sensing period, the scan TFT (S-TFT) is turned off and the sensing TFT (SS-TFT) is turned on. Accordingly, the driving TFT (D-TFT) operates like a constant current source with a constant magnitude, and the current is applied to the reference capacitor through the sensing TFT (SS-TFT). Accordingly, the sensing voltage VSEN increases with a constant voltage increase over time.

Figure 7:
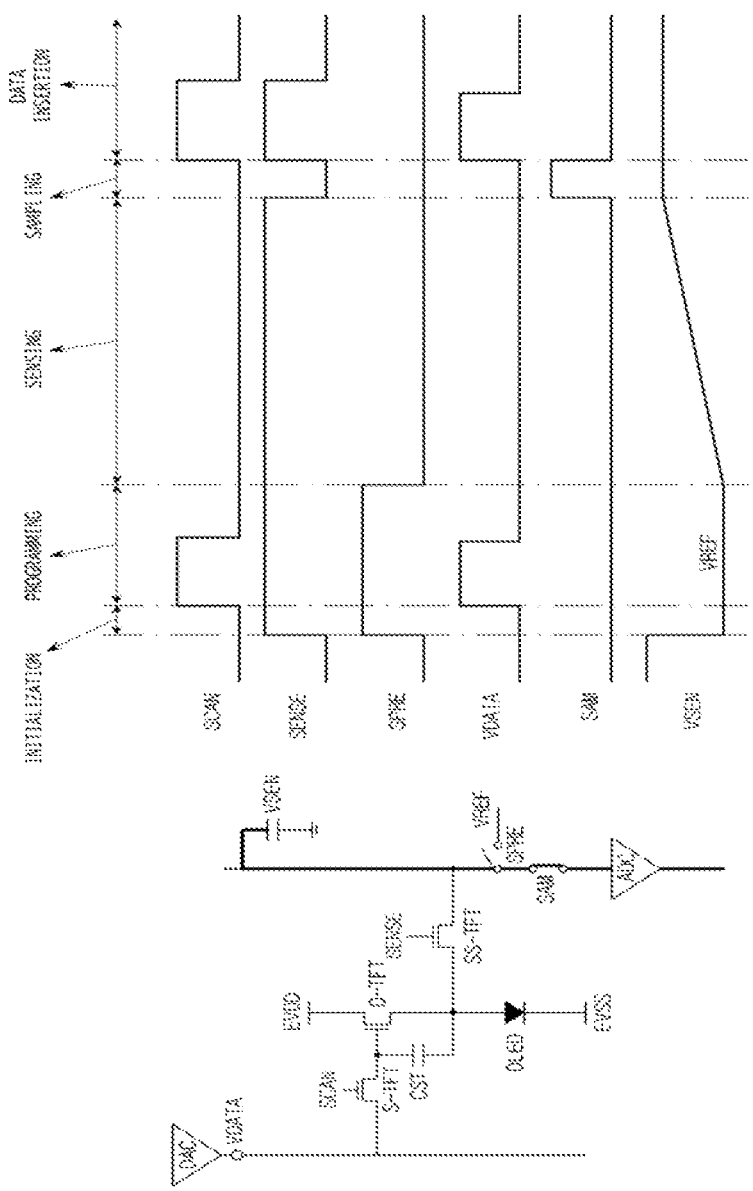

Referring to FIG. 7, in a sampling period, the sensing TFT (SS-TFT) is turned off and another switch SAM is turned on. Accordingly, the sensing voltage VSEN is applied to the source driving IC (S-IC) via the ADC through the reference line REFERENCE. The source driving IC (S-IC) to which the sensing voltage VSEN is applied may calculate the mobility characteristic of the corresponding driving TFT.

Figure 8:
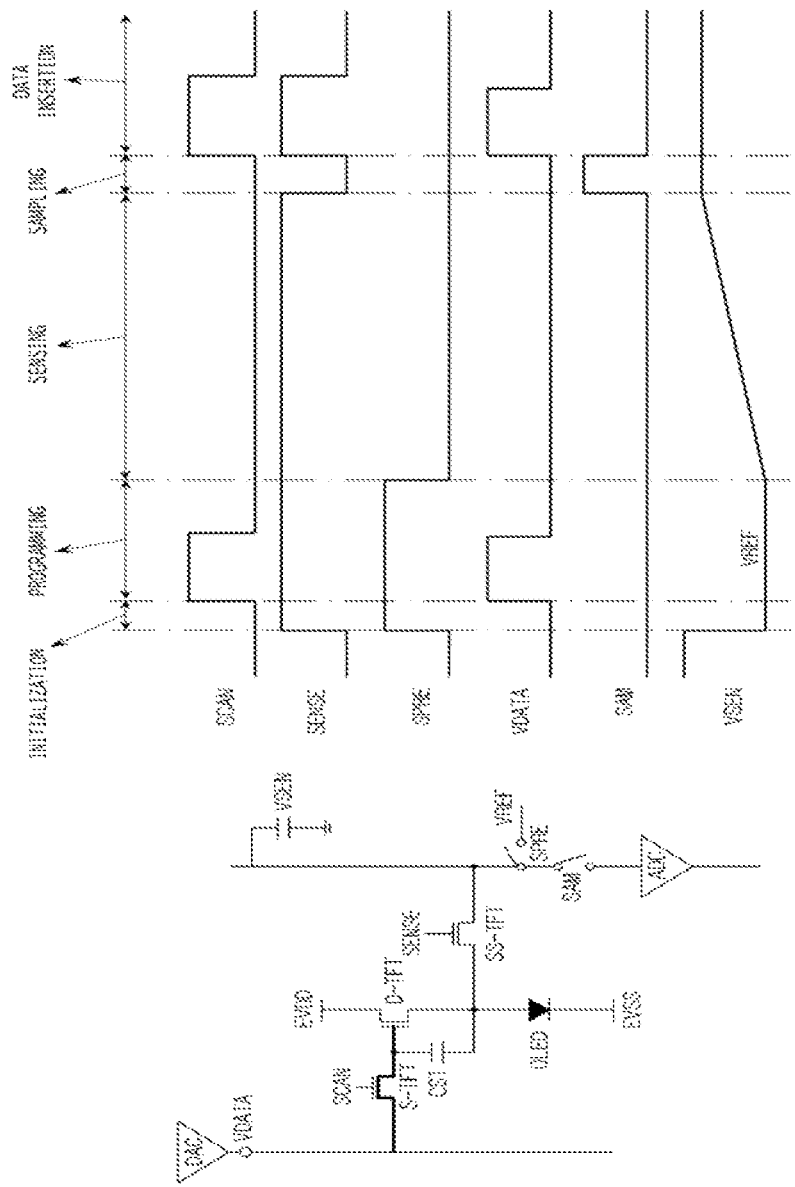

Meanwhile, referring to FIG. 8, in a data insertion period after the sampling period, the scan TFT (S-TFT) is turned on, and the data voltage VDATA is a high voltage. That is, since the real-time compensation is performed, the process of FIGS. 4 to 8 is performed during the blank period between frame and frame. Therefore, a luminance deviation from another data line charged with an existing data voltage occurs. In order to correct the luminance deviation, the data of the previous frame is restored after the sampling period.

Figure 9:
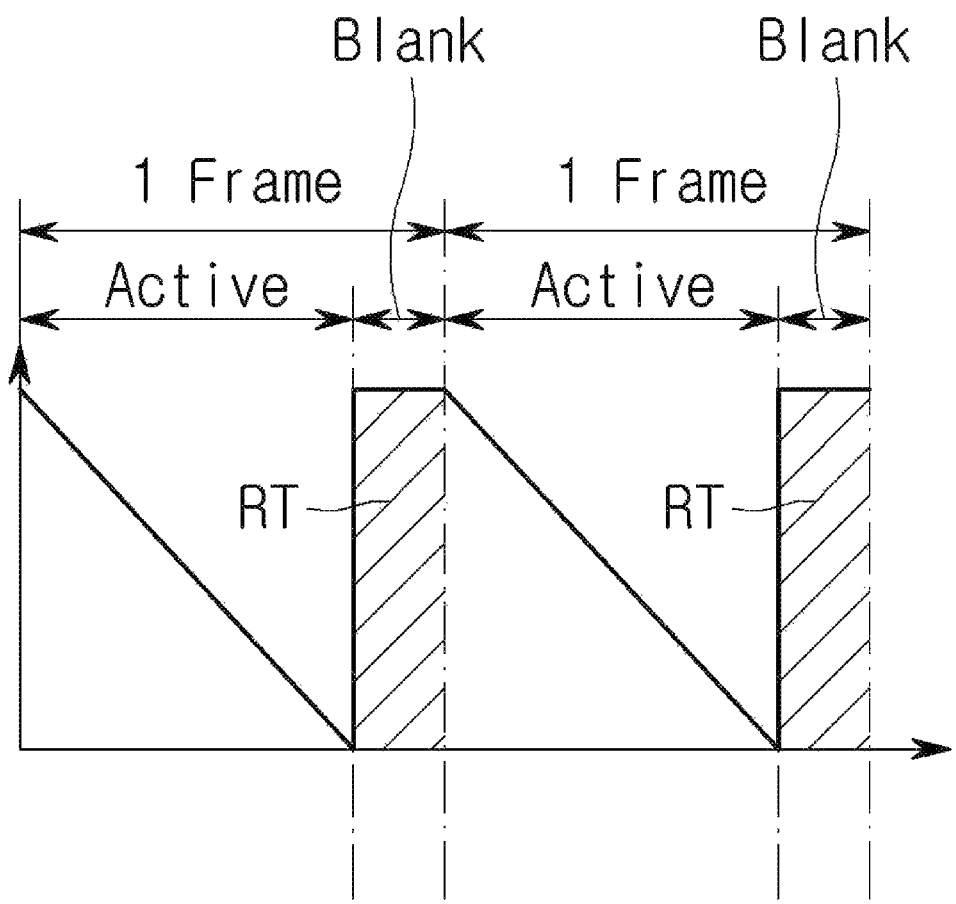
FIG. 9 is a view illustrating one frame of driving the display device according to the present disclosure.

FIG. 9 is a view illustrating one frame of driving the display device according to the present disclosure.

Before a detailed description, one frame period refers to a period in which one image is output. During one frame period, one image may be output through the display panel 50. For example, when a driving frequency is 120 Hz, 120 images may be output through the display panel 50. When the driving frequency is 60 Hz, 60 images may be output through the display panel 50.

For example, in the 120 Hz, an active period may be 8.33 milliseconds (ms), and a blank period may be 300 microseconds (μs). The sum of the active period and the blank period may be one frame period. The sum of a total of 120 frame periods may be 1 second.

Referring to FIG. 9 with FIGS. 1 to 8, one frame may include the active period and the blank period. In an aspect, a sensing period (RT) for sensing the mobility characteristic of the driving TFT may be included within the blank period. As such, the compensation of the pixels performed while the display device is driving to display an image may be referred to as a real-time compensation, and the sensing performed for the real-time compensation may be referred to as an RT sensing. The RT sensing required to be distinguished from a sensing for a compensation before the display device is powered on and from a sensing for a compensation after the display device is powered off.

In addition, as described above, the RT sensing may be performed within one frame period during the blank period that is after the active period.

Figure 10:
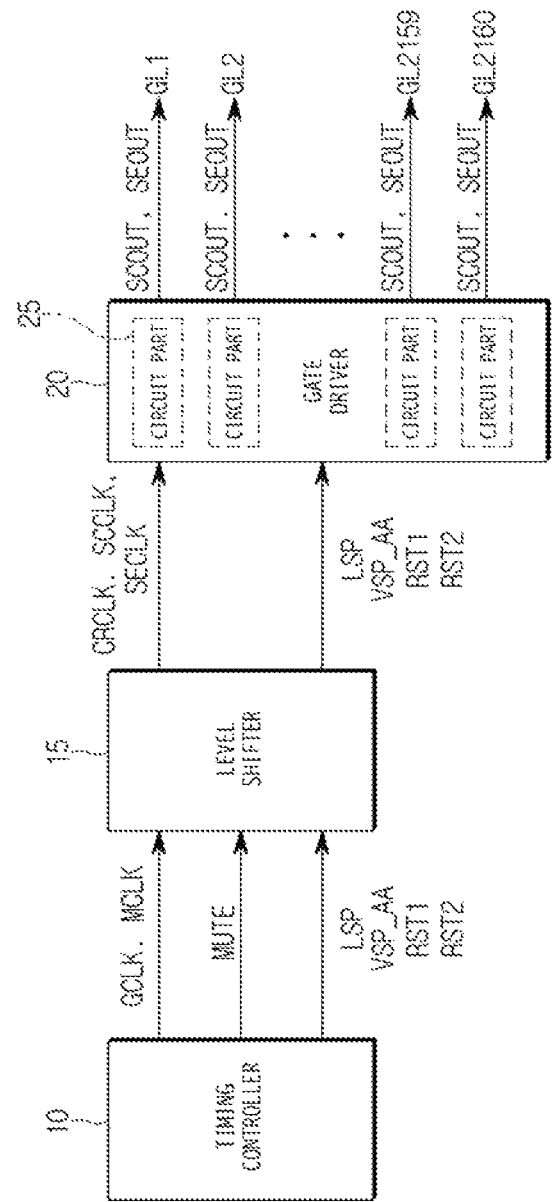
FIG. 10 is a view illustrating a timing controller, a level shifter, and a gate driver.

FIG. 10 is a view illustrating the timing controller, the level shifter, and the gate driver.

Referring to FIG. 10, the timing controller 10 and the level shifter 15 are connected to each other, and the level shifter 15 and the gate driver 20 are connected to each other.

According to an aspect of the present disclosure, the level shifter 15 may be further included between the timing controller 10 and the gate driver 20. The level shifter 15 may receive the first reference signal GCLK, the second reference signal MCLK, the output cancellation signal MUTE, the M-node charge signal LSP, the Q-node total discharge signal VSP_AA, the Q-node charge signal RST1, the Q-node discharge signal RST2, and the like, from the timing controller 10. In addition, the level shifter 15 may transmit the carry clock signal CRCLK, the scan clock signal SCCLK, and the sensing clock signal SECLK to the gate driver 20. These signals may be referred to as a clock signal CLK as a higher concept. In addition, the level shifter 15 may transmit the first reference signal GCLK, the second reference signal MCLK, the output cancellation signal MUTE, the M-node charge signal LSP, the Q-node total discharge signal VSP_AA, the Q-node charge signal RST1, the Q-node discharge signal RST2, and the like that are received from the timing controller 10, to the gate driver 20.

The gate driver 20 may include multiple circuit parts 25, and each of the circuit parts 25 may be disposed as many as the number of the gate lines. As illustrated in FIG. 10, a total number of the circuit parts 25 may be 2160 when a total of 2160 gate lines GL1 to GL2160 are disposed. However, it is not limited thereto, and the number of circuit parts 25 may be less than the number of gate lines. For example, one circuit part 25 may correspond to multiple gate lines (for example, four gate lines). In contrast, the number of circuit parts 25 may be more than the number of gate lines. For example, one or more dummy gate lines may exist before the first gate line GL1. Further, the number of circuits parts 25 corresponding to the number of dummy gate lines may be further disposed.

Each circuit part 25 of the gate driver 20 is operated on the basis of the carry clock signal CRCLK, the scan clock signal SCCLK, the sensing clock signal SECLK, the M-node charge signal LSP, the Q-node total discharge signal VSP_AA, the Q-node charge signal RST1, and the Q-node discharge signal RST2 that are received from the level shifter 15. Specifically, the circuit parts 25 may out put the scan output signal SCOUT and the sensing output signal SEOUT to each of the gate lines GL1 to GL2106. For an example, the scan output signal SCOUT and the sensing output signal SEOUT may be output to one gate line (for example, GLk). One gate line (for example, GLk) may control one subpixel. In another example, two gate lines (for example, GLk-1 and GLk-2) may be disposed, so that the scan output signal SCOUT may be output to one gate line Glk-1, and the sensing output signal SEOUT may be output to one gate line GLk-2. These two gate lines GLk-1 and Glk-2 may control one subpixel.

Figure 11:
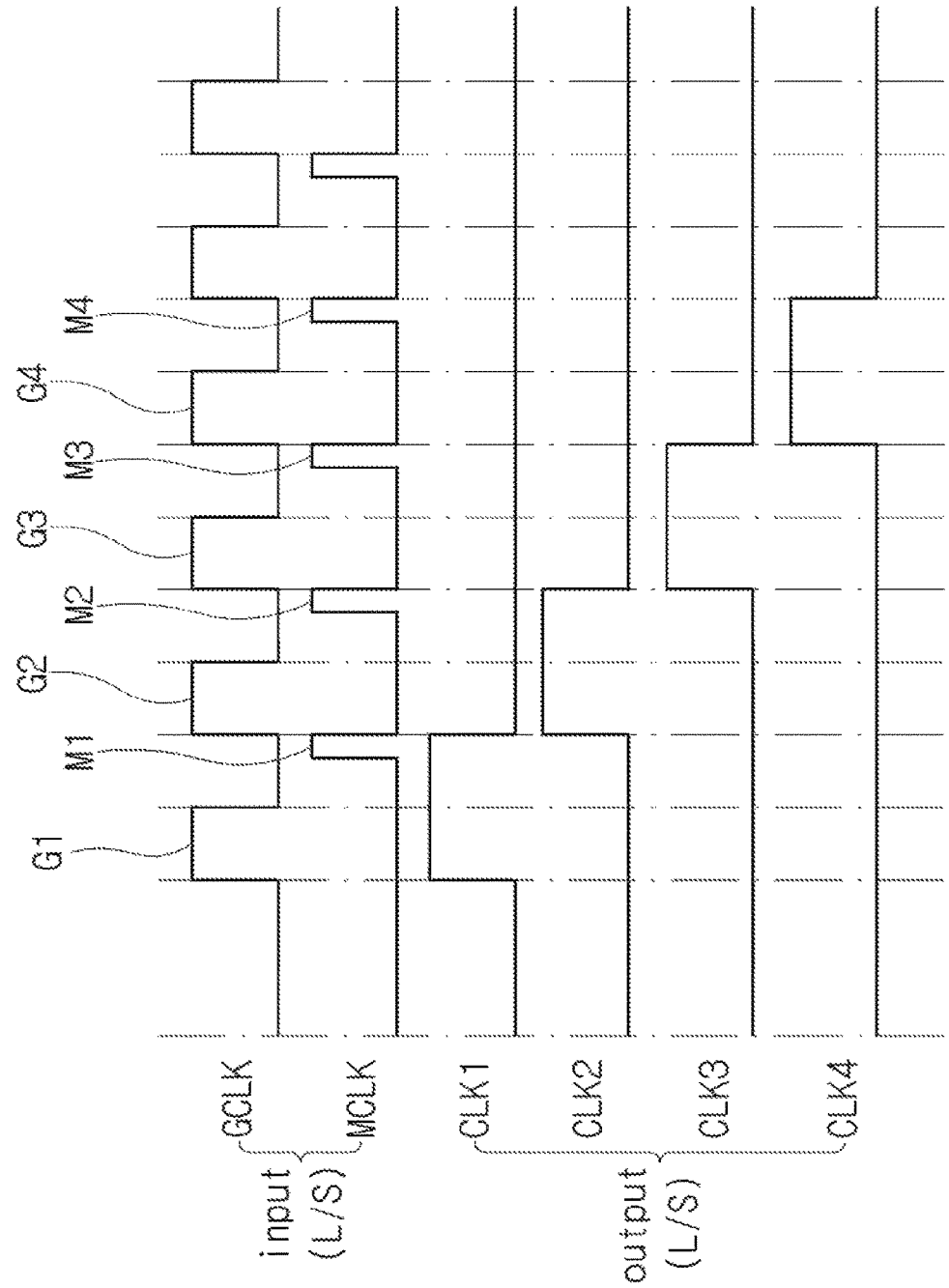
FIGS. 11 and 12 are views illustrating waveforms that illustrate an input and an output of the level shifter according to an aspect of the present disclosure.
Figure 12:
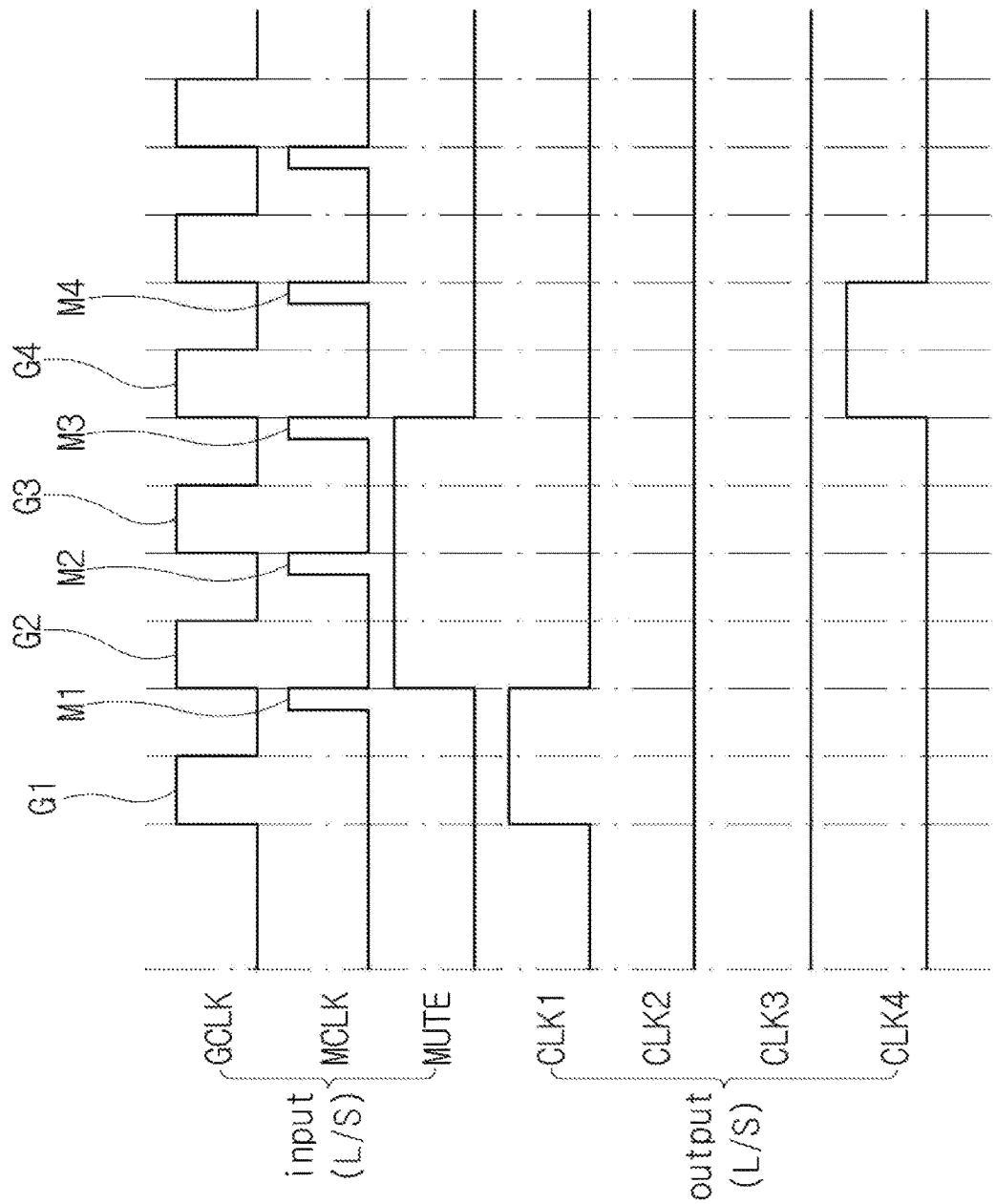

FIGS. 11 and 12 are views illustrating waveforms that illustrate an input and an output of the level shifter according to an aspect of the present disclosure.

As described above, the level shifter 15 may receive the reference signals GCLK and MCLK from the timing controller 10, and the reference signal may include the first reference signal GCLK and the second reference signal MCLK. In addition, the level shifter 15 may output the clock signals CLK1 to CLK4 to the gate driver 20. The clock signals CLK1 to CLK4 may be output to the circuit parts 25 within the gate driver 20. For example, the circuit part 25 connected to the first gate line GL1 may receive the first clock signal CLK1, the circuit part 25 connected to the second gate line GL2 may receive the second clock signal CLK2, the circuit part 25 connected to the third gate line may receive the third clock signal CLK3, and the circuit part 25 connected to the fourth gate line may receive the fourth signal CLK4. The four clock signals are only described as an example, and are not limited thereto. For example, 8, 16, 32, and the like clock signals may be generated.

These clock signals CLK are lower concepts, and may include the carry clock signal CRCLK, the scan clock signal SCCLK, and the sensing clock signal SECLK.

Referring to FIG. 11 again, the level shifter 15 may generate the multiple clock signals CLK1 to CLK4 on the basis of the first reference signal GCLK and the second reference signal MCLK. Specifically, the level shifter 15 may generate the four clock signals CLK1, CLK2, CLK3, and CLK4 on the basis of the first reference signal GCLK and the second reference signal MCLK that are sequentially input at regular time intervals.

For example, the level shifter 15 may generate the first clock signal CLK1 having a rising edge corresponding to a rising edge of a first pulse GL of the first reference signal GCLK. In addition, the level shifter 15 may generate the first clock signal CLK1 so as to have a falling edge corresponding to a falling edge of a first pulse M1 of the second reference signal MCLK.

In the same manner, the level shifter 15 may generate the second clock signal CLK2 so as to have a rising edge corresponding to a rising edge of a second pulse G2 of the first reference signal GCLK and to have a falling edge corresponding to a falling edge of a second pulse M2 of the second reference signal MCLK. In addition, the level shifter 15 may generate the third clock signal CLK3 so as to have a rising edge corresponding to a rising edge of a third pulse G3 of the first reference signal GCLK and to have a falling edge corresponding to a falling edge of a third pulse M3 of the second reference signal MCLK. In addition, the level shifter 15 may generate the fourth clock signal CLK4 so as to have a rising edge corresponding to a rising edge of a fourth pulse G4 of the first reference signal GCLK and to have a falling edge corresponding to a falling edge of a fourth pulse M4 of the second reference signal MCLK.

By this process, the level shifter 15 may generate the first clock signal CLK1, the second clock signal CLK2, the third clock signal CLK3, and the fourth clock signal CLK4 that are sequentially delayed by the period of the first reference signal GCLK.

Referring to FIG. 12, the output cancellation signal MUTE is illustrated. As same as the reference signals GCLK and MCLK, the output cancellation signal MUTE is a signal in which the level shifter 15 receives from the timing controller 10, and is used to control output of the level shifter 15. Further, the output cancellation signal MUTE may not be transmitted to the gate driver 20.

The output cancellation signal MUTE is a signal for controlling a signal output from the level shifter 15 to the gate driver 20 is not to be output temporarily. For example, when the output cancellation signal MUTE is a high signal, the clock signals CLK1 to CLK4 may not be output temporarily from the level shifter 15. When the output cancellation signal MUTE is a low signal, the clock signals CLK1 to CLK4 may be output from the level shifter 15.

As illustrated in FIG. 12, the output cancellation signal MUTE has a rising edge corresponding to the rising edge of the second pulse G2 of the first reference signal GCLK, and has a falling edge corresponding to the falling edge of the third pulse M3 of the second reference signal MCLK. Therefore, during from the second pulse G2 of the first reference signal GCLK to the third pulse M3 of the second reference signal MCLK, the output cancellation signal MUTE is in a high level. Further, during a remaining period, the output cancellation signal MUTE is in a low level.

Since the clock signal is not output from the level shifter 15 during a period in which the output cancellation signal MUTE is in the high level, the second clock signal CLK2 and the third clock signal CLK3 may not be output. Since the clock signal is output from the level shifter 15 during a period in which the output cancellation signal MUTE is in the low level, the first clock signal CLK1 and the fourth clock signal CLK4 may not be output.

However, the output cancellation signal MUTE is a control signal that temporarily suspends the output of the level shifter 15, and is not a signal that controls the input of the level shifter 15. Therefore, regardless of a voltage level of the output cancellation signal MUTE, the level shifter 15 receives signals from the timing controller 10.

Figure 13:
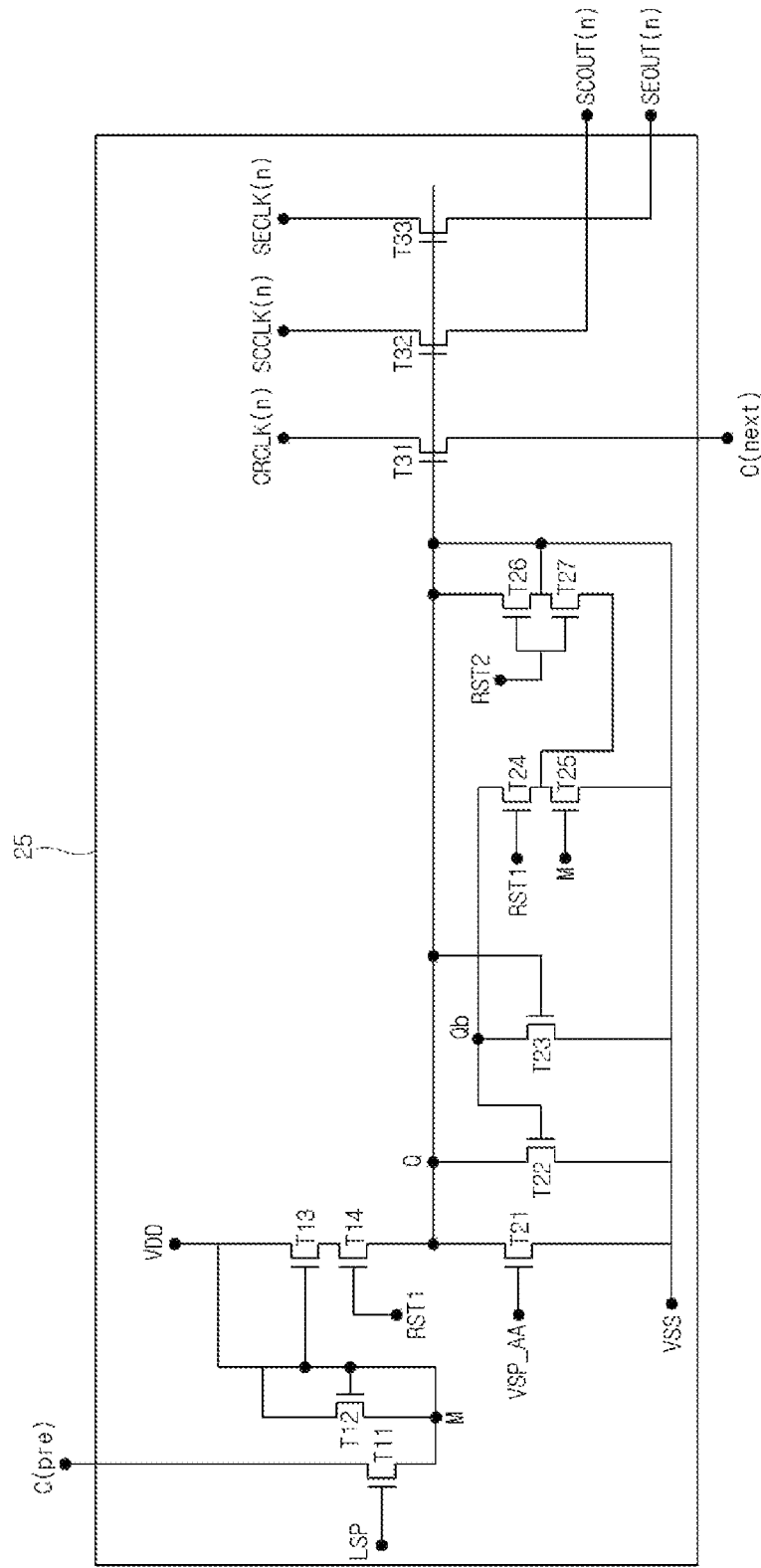
FIG. 13 is a view illustrating a circuit part disposed within the gate driver according to an aspect of the present disclosure.

FIG. 13 is a view illustrating the circuit part disposed within the gate driver according to an aspect of the present disclosure.

Referring to FIG. 13, the circuit part 25 disposed within the gate driver 20 is illustrated.

As described above, the gate driver 20 may include the multiple circuit parts 25, and each of the circuit parts 25 may be disposed as many as the number of the gate lines. Alternatively, one circuit part 25 may correspond to multiple (for example, four) gate lines GLj to GLj+3. Further, in this case, the number of each circuit part 25 may be less than the number of gate lines. Alternatively, a dummy gate line may exist before the first gate line GL1. Further, in this case, the number of each circuit part 25 may be greater than the number of gate lines.

The circuit part 25 is operated on the basis of the carry clock signal CRCLK, the scan clock signal SCCLK, the sensing clock signal SECLK, the M-node charge signal LSP, the Q-node total discharge signal VSP_AA, the Q-node charge signal RST1, and the Q-node discharge signal RST2 that are received from the level shifter 15.

First, the M-node charge signal LSP is a signal that charges an M-node within the circuit part 25. Referring to FIG. 13, when the M-node charge signal LSP is applied when a carry C(pre) is received from the previous circuit part 25 (that is, the circuit part 25 corresponding to an n-1th gate line), a transistor T11 is turned on and the M-node is charged with the carry. When a transistor T12 is turned on by charging of the carry due to carry charging, a high potential voltage VDD is applied to the M-node. That is, the M-node is charged by the M-node charge signal LSP.

The previous circuit part may be the circuit part (the circuit part 25 corresponding to the n-1th gate line) immediately preceding the previous circuit part, or may be the circuit part (the circuit part 25 corresponding to an n-2th or an n-3th gate line) before the immediately preceding circuit part.

The Q-node charge signal RST1 is a signal that transmits the charging voltage of the M-node to a Q-node. Referring to FIG. 13, a transistor T13 is turned on when the M-node is charged. When the Q-node charge signal RST1 is applied, a transistor T14 is turned on, so that the high potential voltage VDD is applied to the Q-node. That is, the Q-node is charged by the Q-node charge signal RST1.

The Q-node and a Qb-node have opposite levels from each other. For example, when the Q-node is charged and is in the high level, a transistor T23 is turned on, so that a low potential voltage VSS is applied to the Qb-node. In contrast, when the Qb-node is in the high level, a transistor T22 is turned on, so that the low potential voltage VSS is applied to the Q-node. In addition, when the M-node is charged and the Q-node is charged by the Q-node charge signal RST1, transistors T24 and T25 are turned on, so that the low potential voltage VSS is applied to the Qb-node.

The Q-node discharge signal RST2 is a signal that discharges the Q-node that is charged due to the charging of the M-node. Referring to FIG. 13, when the Q-node discharge signal RST2 is applied, transistors T26 and T27 are turned on, and the low potential voltage VSS is applied to the Q node.

The Q-node total discharge signal VSP_AA is a signal that temporarily discharges all the circuit parts 25 included in the gate driver 20. Referring to FIG. 13, when the Q-node total discharge signal VSP_AA is applied, a transistor T21 is turned on, and the low potential voltage VSS is applied to the Q-node. Since the Q-node total discharge signal VSP_AA is connected in parallel to all circuit parts 25, the discharging of all circuit parts 25 may be controlled by the Q-node total discharge signal VSP_AA.

The output of the circuit part 25 may be controlled by charging/discharging of the Q-node. Referring to FIG. 13, when the carry clock signal CRCLK(n) is input while the Q-node is charged, the carry clock signal CRCLK(n) may be output to the subsequent circuit part (for example, the circuit part 25 connected to an n+1th gate line). In addition, when the scan clock signal SCCLK(n) is input while the Q-node is charged, the scan clock signal SCCLK(n) may be output as the scan output signal SCOUT(n). In addition, when the sensing clock signal SECLK(n) is entered while the Q node is charged, the sensing clock signal SECLK(n) may be output as the sensing output signal SEOUT(n).

The subsequent circuit part may be the next circuit part (the circuit part 25 corresponding to the n+1th gate line), or may be the further next circuit part (the circuit part 25 corresponding to an n+2th or an n+3th gate line) after the immediately preceding circuit part.

Figure 14:
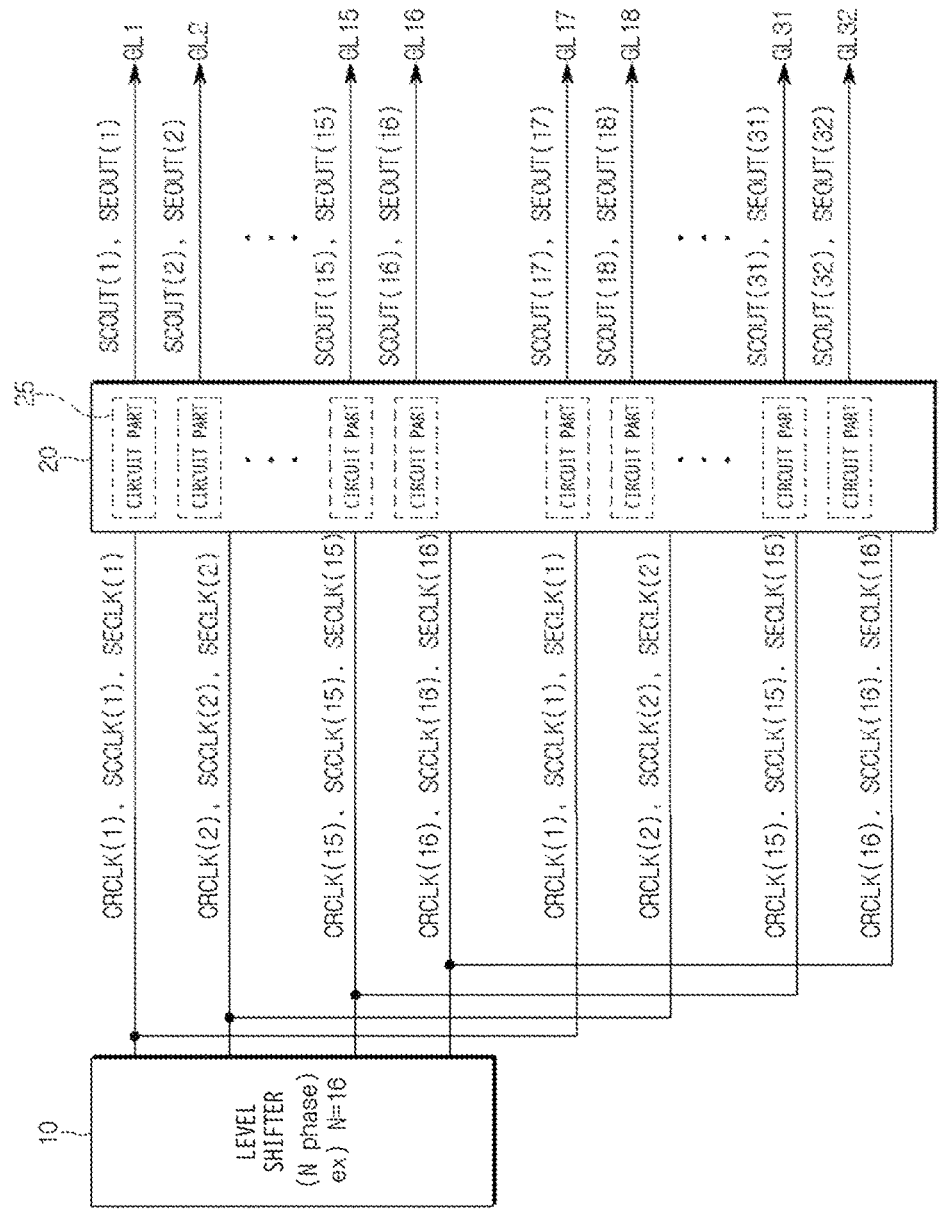
FIG. 14 is a view illustrating an output of an N-phase level shifter according to the present disclosure.

FIG. 14 is a view illustrating an output of an N-phase level shifter according to the present disclosure.

According to the present disclosure, an N-phase level shifter is disclosed. As an example, N is 16, but the N may be a different number.

A 16-phase level shifter 15 refers to the level shifter 15 that outputs 16 types of clock signals CRCLK, SCCLK, and SECLK.

Specifically, the 16-phase level shifter 15 receives the first reference signal GCLK and the second reference signal MCLK as an input from the timing controller 10. In addition, the 16-phase level shifter 15 outputs 16 types of carry clock signals CRCLK(1) to CRCLK(16), 16 types of scan clock signals SCCLK(1) to SCCLK(16), and 16 types of sensing clock signals SECLK(1) to SECLK(16) to the circuit parts 25 of the gate driver 20. A method in which the 16-phase level shifter generates the clock signals CRCLK, SCCLK, and SECLK is based on the first reference signal GCLK and the second reference signal MCLK, and is the same as an example previously described.

The first carry clock signal CRCLK(1), the first scan clock signal SCCLK(1), and the first sensing clock signal SECLK(1) that are output from the 16-phase level shifter 15 are input to the first circuit part 25 and the 17th circuit part 25. The first circuit part 25 is the circuit part connected to the first gate line GL1, and the 17th circuit 25 is the circuit part connected to the 17th gate line GL17. Although not illustrated in drawings, the first carry clock signal CRCLK(1) is input to the 33rd circuit part 25, the 49th circuit part 25, and the like. The first circuit part 25 that received the first scan clock signal SCCLK(1), the 17th circuit part 25, and the like output the scan output signals SCOUT(1) and the like to the gate lines GL1, GL17, and the like that are respectively connected thereto. The first circuit part 25 that received the first sensing clock signal SECLK(1), the 17th circuit part 25, and the like output the sensing output signals SEOUT(1), SCOUT(17), and the like to the gate lines GL1, GL17, and the like that are respectively connected thereto. Although not illustrated in drawings, the first scan clock signal SCCLK(1) and the first sensing clock signal SECLK(1) are input to the 33rd circuit part 25, the 49th circuit part 25, and the like.

The 16th carry clock signal CRCLK(16), the 16th scan clock signal SCCLK(16), and the 16th sensing clock signal SECLK(16) that are output from the 16-phase level shifter 15 are input to the 16th circuit part 25 and the 32nd circuit part 25. The 16th circuit part 25 is the circuit part connected to the 16th gate line GL16, and the 32nd circuit part 25 is the circuit part connected to the 32nd gate line GL32. Although not illustrated in drawings, the 16th carry clock signal CRCLK(16) is input to the 48th circuit part 25, the 54th circuit part 25, and the like. The 16th circuit part 25 that received the 16th scan clock signal SCCLK(16), the 32nd circuit part 25, and the like output the scan output signals SCOUT(16), SCOUT(32), and the like to the gate lines GL16, GL32, and the like that are respectively connected thereto. The 16th circuit part 25 that received the 16th sensing clock signal SECLK(16), the 32nd circuit part 25, and the like output the sensing output signals SEOUT(16), SEOUT(32), and the like to the gate lines GL16, GL32, and the like that are respectively connected thereto. Although not illustrated in drawings, the 16th scan clock signal SCCLK(16) and the 16th sensing clock signal SECLK(16) are input to the 48th circuit part 25, the 54th circuit part 25, and the like.

Figure 15:
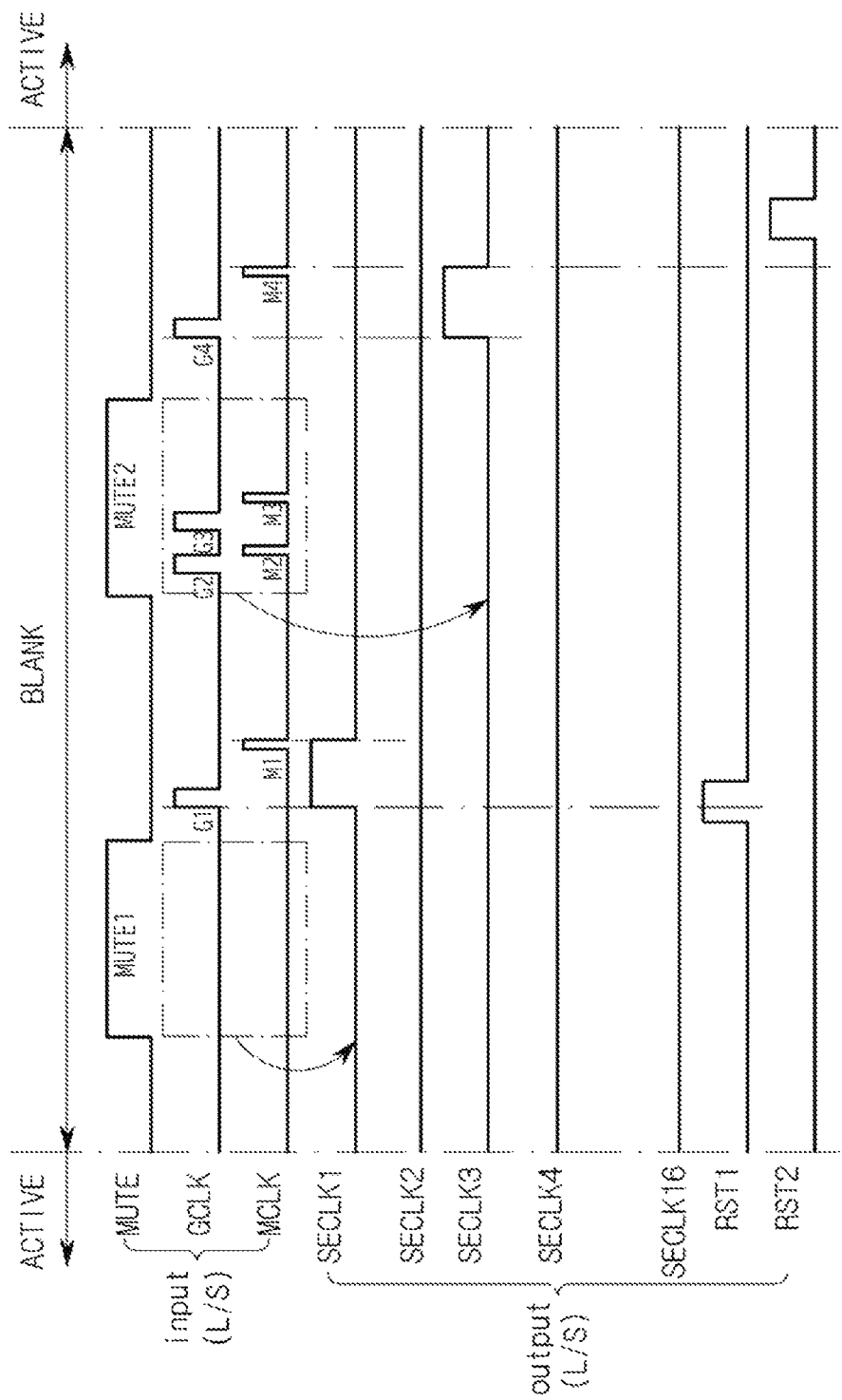
FIG. 15 is a view illustrating a control of the N-phase level shifter according to the present disclosure.

FIG. 15 is a view illustrating a control of the N-phase level shifter according to the present disclosure.

According to the present disclosure, the N-phase level shifter is disclosed. As an example, N is 16, but the N may be a different number.

In addition, a control in the present aspect is performed at a blank period BLANK during one frame. That is, the present aspect relates to a sensing performed on the subpixel to compensate for the mobility characteristic of the subpixel. That is, the compensation in the present aspect relates to the sensing for compensation performed at the blank period BLANK while the display device is powered on and outputs image data.

The control of the level shifter 15 described with reference to FIG. 15 is on the basis of the description described with reference to the previous drawings.

Referring to FIG. 15, the level shifter 15 receives the output cancellation signal MUTE, the first reference signal GCLK, and the second reference signal MCLK as an input from the timing controller 10, and outputs the 16 types of the sensing clock signals SECLK1 to SECLK16, the Q-node charge signal RST1, and the Q-node discharge signal as an output from the timing controller 10 to the circuit part 25 of the gate driver 20.

Specifically, the output cancellation signal MUTE input to the level shifter 15 includes at least two pulses. In FIG. 15, two pulses MUTE1 and MUTE2 are illustrated as an example. According to the present disclosure, the number of pulses of the output cancellation signal MUTE generated during the blank period BLANK is equal to the number of gate lines that are selected for sensing. That is, when the output cancellation signal MUTE having two pulses is input to the level shifter 15, two gate lines are the target of sensing. Soon, the subpixels included in the gate lines that are selected as the target of sensing become the target of sensing. For the 16-phase level shifter 15, the output cancellation signal MUTE may include two or more and 16 or less pulses. Therefore, according to the present disclosure, there may be multiple gate lines being sensed during one blank period BLANK. That is, during one sensing period, multi-sensing may be capable of being performed.

A pulse of the first reference signal GCLK and the second reference signal MCLK may be generated within the pulses MUTE1 and MUTE2 of the output cancellation signal MUTE. According to the present disclosure, the gate line that is selected as the target of sensing is determined on the basis of the number of pulses of the first reference signal GCLK and the second reference signal MCLK. Referring to FIG. 15, during the first pulse MUTE1 of the output cancellation signal MUTE, the number of pulses of the first reference signal GCLK and the second reference signal MCLK is zero. Therefore, the gate line selected for the target of sensing may be the first gate line. That is, the gate line that corresponds to the number+1 of the first reference signal GCLK and the second reference signal MCLK generated during the pulse of the output cancellation signal MUTE may be selected for the target of sensing. Referring to FIG. 15, during the second pulse MUTE2 of the output cancellation signal MUTE, the number of pulses of the first reference signal GCLK and the second reference signal MCLK is two. That is, G2, G3 and M2, M3, respectively. Therefore, the gate line selected for the target of sensing may be the third gate line. This is because, in the same example, the gate line that corresponds to the number+1 of the first reference signal GCLK and the second reference signal MCLK generated during the pulse of the output cancellation signal MUTE may be selected as the target for sensing.

On the other hand, +1 is an example, and other parameters (For example, +0, −1, and so on) may be used interchangeably, and are included in the technical idea of the present disclosure.

As described previously, the gate lines selected as the target of sensing are the first gate line that is a first order and the third gate line that is a third order. Therefore, the sensing clock signals output from the level shifter 15 to the gate driver 20 are the first sensing clock signal SECLK1 and the third sensing clock signal SECLK3. More specifically, among the 16 types of the sensing clock signals SECLK1 to SECLK16 output from the 16-phase level shifter 15, the first sensing clock signal SECLK1 and the third sensing clock signal SECLK3 that correspond to the selected gate lines (the first gate line and the third gate line) have pulses. However, the sensing clock signals SECLK2 and SECLK4 to SECLK16 corresponding to the remaining gate lines do not have pulses.

In order to produce the first sensing clock signal SECLK1 that is selected, the level shifter 15 receives one first reference signal G1 and one second reference signal M2 after the first pulse MUTE1 of the output cancellation signal MUTE. The first sensing clock signal SECLK1 has a rising edge that corresponds to a rising edge of the first reference signal G1 and may have a falling edge that corresponds to a falling edge of the second reference signal M1. Here, the reference signals GCLK and MCLK required to be generated after the first pulse MUTE1. This is because the first sensing clock signal SECLK1 output from the level shifter 15 is limited during the first pulse MUTE1 of the output cancellation signal MUTE.

In addition, in order to produce the third sensing clock signal SECLK3 that is selected, the level shifter 15 receives one first reference signal G4 and one second reference signal M4 after the second pulse MUTE2 of the output cancellation signal MUTE. The third sensing clock signal SECLK3 has a rising edge that corresponds to a rising edge of the first reference signal G4 and may have a falling edge that corresponds to a falling edge of the second reference signal M4. Here, the reference signals GCLK and MCLK required to be generated after the second pulse MUTE2. This is because the third sensing clock signal SECLK3 output from the level shifter 15 is limited during the second pulse MUTE2 of the output cancellation signal MUTE.

Here, according to the present disclosure, multiple sensing clock signals that are selected are required not to be overlapped. For example, the sensing clock signal selected by the first reference signal GCLK and the second reference signal MCLK that are generated during the first pulse MUTE1 of the output cancellation signal MUTE is required not to be the same as the sensing clock signal selected by the first reference signal GCLK and the second reference signal MCLK that are generated during the second pulse MUTE2 of the output cancellation signal MUTE. This is because, when the sensing clock signals are the same, the same line is sensed If the sensing clock signals are the same, the same line is sensed in an overlapping manner. In other words, the number of reference signals GCLK and MCLK that are generated during the first pulse MUTE1 may be different from the number of reference signals GCLK and MCLK that are generated during the second pulse MUTE2.

The Q-node charge signal RST1 may be output before the first sensing clock signal SECLK1 is output. This is because, as previously described, the Q-node of the circuit part 25 within the gate driver 20 is required to be charged in order to generate the sensing clock signal SECLK.

In addition, the Q-node discharge signal RST2 may be output after the third sensing clock signal SECLK3 is output. This is because, as previously described, the sensing clock signal SECLK is unable to be output when the Q-node of the circuit part 25 within the gate driver 20 is discharged. In addition, this is because the Q-node is required to be initialized before an active period ACTIVE starts after the blank period BLANK is ended.

Referring to FIG. 15 mainly and further referring to the previous drawings, an aspect of the present disclosure is as follows. In the present description, the number of N is 16 as an example.

The level shifter 15 according to the present disclosure may be the N-phase level shifter 15. From the timing controller 10, the N-phase level shifter 15 may receive the output cancellation signal MUTE, the first reference signal GCLK, and the second reference signal MCLK. In addition, the N-phase level shifter 15 may output the N number of sensing clock signals SECLK1 to SECLK16 to the gate driver 20.

The N number of sensing clock signals SECLK1 to SECLK16 that are output from the level shifter 15 according to the present disclosure may be input to the gate driver 20. After receiving the N number of sensing clock signals SECLK1 to SECLK16, the gate driver 20 may output the first to the N-th sensing output signals SEOUT to the first to the N-th gate lines GL1 to GLN. For example, the circuit part 25 within the gate driver 20 may receive the first sensing clock signal SECLK1, and may output the first sensing output signal SEOUT1 to the first gate line GL1. Similarly, another circuit part 25 within the gate driver 20 may receive the 16th sensing clock signal SECLK16, and may output the 16th sensing output signal SEOUT16 to the 16th gate line GL16.

As previously described, the N-phase level shifter 15 may output a total of N sensing clock signals SECLK1 to SECLK16. For example, the first sensing clock signal SECLK1 may be input to the multiple circuit parts 25, and the multiple circuit parts 25 may be the circuit parts 25 that output the first sensing output signal SEOUT1, the 17th sensing output signal SEOUT17, the 33rd sensing output signal SEOUT33, and the like. The second to the N-th sensing clock signals may also be output to the circuit parts 25 according to the same principle. That is, the N-th sensing clock signal SECLKN output from the N-phase level shifter 15 may be connected to the circuit parts 25 that output the N+16kth sensing output signal SEOUT (k is a natural number at least zero).

The N-phase level shifter 15 may also output a total of N other clock signals (for example, the carry clock signal CRCLK and the scan clock signal SCCLK).

According to the present disclosure, the N-phase level shifter 15 may receive the output cancellation signal having a number of pulses, and the a may be at least two. In addition, as described above, the gate line that is target for sensing is determined on the basis of the reference signal input during the output cancellation signal. Referring to FIGS. 9 and 15, the blank period is a period of defining one frame period with the active period, and the compensation for the subpixel of the display device and the sensing for the compensation may be performed during the blank period. That is, the real-time compensation performed during a normal driving after the display device is turned on may be performed during the blank period. According to the present disclosure, the a may be at least two. That is, during one period of sensing (blank period), sensing of two or more gate lines may be performed.

Specifically, referring to FIG. 15, it is illustrated in that the output cancellation signal MUTE has two pulses MUTE1 and MUTE2 as an example. on the basis of the number of pulses of the output cancellation signal MUTE, the number of gate lines that are sensed during the blank period may be determined. For example, when three pulses are input, three gate lines may be determined to be the target of sensing. In some cases, the gate lines having smaller number than the number fewer gate lines than the number of pulses may be determined to be the target of sensing. For example, when three pulses are input, one pulse is used for other purpose, and the remaining two pulses may become parameters that determine the gate lines (for example, two gate lines) that are to be the target of sensing.

Referring to FIG. 15, the N-phase level shifter may receive the first reference signal GCLK and the second reference signal MCLK during the pulse of the output cancellation signal MUTE. The number of the first reference signal GCLK and the second reference signal MCLK may be used to determine the number of sensing clock signals (b, c, and the like). For example, referring to FIG. 15, zero first reference signal GCLK and zero second reference signal MCLK are input during the first pulse MUTE1 of the output cancellation signal MUTE. In this case, the first sensing clock signal SECLK1 may be determined. That is, it refers to that the first gate line GL1 is determined to be the target of sensing. That is, the number b of sensing clock signals is ranged between one and N, and the number of the first reference signal GCLK and the number of second reference signal MCLK that are input during the first pulse MUTE1 so as to determine a b-th sensing clock signal SECLKb may be b-1. similarly, referring to FIG. 15, two first reference signal G2, G3 and two second reference signal M2, M3 are input during the second pulse MUTE2 of the output cancellation signal MUTE. In this case, the third sensing clock signal SECLK3 may be determined. That is, it refers to that the third gate line GL3 is determined to be the target of sensing. That is, the number c of sensing clock signals is ranged between one and N, and the number of the first reference signal GCLK and the number of second reference signal MCLK that are input during the second pulse MUTE2 so as to determine a c-th sensing clock signal SECLKc may be c-1.

Here, the b and the c may be different from each other. This is because, when the b and the c are the same, it refers to that sensing are performed twice on the same gate line. In this case, the accuracy of the sensing may be improved due to the repeated sensing. However, unnecessary sensing as an overlapped sensing may be performed.

In order to generate the b-th sensing clock signal (SECLK1 in FIG. 15) as described above, the N-phase level shifter 15 may receive one first reference signal G1 and one second reference signal M2 after the first pulse MUTE1. This is because, when the reference signals are input during the first pulse MUTE1, the clock signal is not to be output to the gate driver 20 from the level shifter 14 due to the operating principle of the MUTE signal.

Similarly, in order to generate the c-th sensing clock signal (SECLK3 in FIG. 15), the N-phase level shifter 15 may receive one first reference signal G4 and one second reference signal M4 after the second pulse MUTE2. This is because, when the reference signals are input during the second pulse MUTE2, the clock signal is not to be output to the gate driver 20 from the level shifter 15 due to the operating principle of the MUTE signal.

In addition, the N-phase level shifter 15 may output the Q-node charge signal RST1 to gate driver 20 before the b-th sensing clock signal (SECLK1 in FIG. 15) is output. This is because, in order to output the clock signals SECLK, CRCLK, SCCLK, and the like from the gate driver 20, charging of the M-node is required to be moved to the Q-node.

In addition, the N-phase level shifter 15 may output the Q-node discharge signal RST2 to the gate driver 20 after the c-th sensing clock signal (SECLK3 in FIG. 15) is output. This is because, the Q-node of the gate driver 20 needs to be initialized before the active period ACTIVE is started.

It will be understood by those skilled in the art that the present disclosure can be embodied in other specific forms without changing the technical idea or essential characteristics of the present disclosure. Therefore, it should be understood that the aspects described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. A display device comprising:
   an N-phase level shifter configured to:
      receive an output cancellation signal, a first reference signal, and a second reference signal from a timing controller,
      count a number of pulses in at least one of the first reference signal and the second reference signal, and
      output a plurality of sensing clock signals to a gate driver based on inhibiting output of a number of clock signals corresponding to the number of pulses; and
   wherein the gate driver is configured to receive the plurality of sensing clock signals from the N-phase level shifter and to output a plurality of sensing output signals to first to n-th gate lines,
   wherein the N-phase level shifter is configured to inhibit output of a portion of the sensing clock signals of the plurality of sensing clock signals based on the number of pulses.

2. The display device of claim 1, wherein gate lines configured to receive the plurality of sensing output signals are determined based on the output cancellation signal.

3. The display device of claim 2, wherein the number of gate lines that are sensed during the blank period is equal to the first number.

4. The display device of claim 1, wherein the output cancellation signal comprises a first pulse defining an interval for a first function of the N-phase level shifter, and a second pulse defining an interval for a second function of the N-phase level shifter.

5. The display device of claim 4, wherein an order "b" of the sensing clock signal is determined on the basis of the number of pulses that are input during the first pulse, and the number of "b" is ranged between one and N.

6. The display device of claim 5, wherein, when "b"–1 first reference signals and "b"–1 second reference signals are input during the first pulse, a "b"th sensing clock signal is determined.

7. The display device of claim 6, wherein the N-phase level shifter is configured to receive one first reference signal and one second reference signal after the first pulse in order to generate the "b"th sensing clock signal.

8. The display device of claim 6, wherein the N-phase level shifter is configured to output a Q-node charge signal before the "b"th sensing clock signal is output.

9. The display device of claim 5, wherein an order "c" of the sensing clock signal is determined on the basis of the number of pulses that are input during the second pulse, and the number of "c" is ranged between one and N.

10. The display device of claim 9, wherein, when "c"–1 first reference signals and "c"–1 second reference signals are input during the second pulse, a "c"th sensing clock signal is determined.

11. The display device of claim 10, wherein the number of "b" and the number of "c" are different from each other.

12. The display device of claim 10, wherein the N-phase level shifter is configured to receive one first reference signal and one second reference signal after the second pulse in order to generate the "c"th sensing clock signal.

13. The display device of claim 10, wherein the N-phase level shifter is configured to output a Q-node discharge signal after the "c"th sensing clock signal is output.

14. The display device of claim 4, wherein the first function corresponds to identification of gate lines for receiving a next clock signal.

15. The display device of claim 14, wherein the second function corresponds to timing of pulses of the next clock signal.

* * * * *